(12) United States Patent
Minekawa et al.

(10) Patent No.: US 11,501,950 B2
(45) Date of Patent: Nov. 15, 2022

(54) CHARGED PARTICLE BEAM DEVICE

(71) Applicant: Hitachi High-Tech Corporation, Tokyo (JP)

(72) Inventors: Yohei Minekawa, Tokyo (JP); Kohei Chiba, Tokyo (JP); Muneyuki Fukuda, Tokyo (JP); Takanori Kishimoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/330,500

(22) Filed: May 26, 2021

(65) Prior Publication Data

US 2021/0391140 A1 Dec. 16, 2021

(30) Foreign Application Priority Data

Jun. 12, 2020 (JP) .............................. JP2020-101998

(51) Int. Cl.
| | |
|---|---|
| *H01J 37/22* | (2006.01) |
| *H01J 37/26* | (2006.01) |
| *H01J 37/28* | (2006.01) |

(52) U.S. Cl.
CPC .......... *H01J 37/222* (2013.01); *H01J 37/263* (2013.01); *H01J 37/265* (2013.01); *H01J 37/28* (2013.01)

(58) Field of Classification Search
CPC .. H01J 37/00; H01J 37/02; H01J 37/22; H01J 37/222; H01J 37/263; H01J 37/265; H01J 37/28; H01J 37/26; G01N 23/2251; G06T 7/0004

USPC .......................................... 250/306, 307, 311
See application file for complete search history.

(56) References Cited

U.S. PATENT DOCUMENTS

| | | | | |
|---|---|---|---|---|
| 2007/0210252 | A1* | 9/2007 | Miyamoto | ............ H01J 37/265 250/310 |
| 2017/0256051 | A1* | 9/2017 | Dwivedi | .................. G06T 7/13 |

FOREIGN PATENT DOCUMENTS

JP  2007-329081 A  12/2007

* cited by examiner

*Primary Examiner* — Jason L McCormack
(74) *Attorney, Agent, or Firm* — Crowell & Moring LLP

(57) ABSTRACT

Provided is a technique capable of achieving both throughput and robustness for a function of adjusting brightness (B) and contrast (C) of a captured image in a charged particle beam device. The charged particle beam device includes a computer system having a function (ABCC function) of adjusting the B and the C of an image obtained by imaging a sample. The computer system determines whether adjustment is necessary based on a result obtained by evaluating a first image obtained by imaging an imaging target of the sample (step S2), executes, when the adjustment is necessary based on a result of the determination, the adjustment on a second image of the imaging target to set an adjusted B value and an adjusted C value (step S4), and captures a third image of the imaging target based on the adjusted setting values to generate an image for observation (step S5).

8 Claims, 19 Drawing Sheets

[FIG. 1]
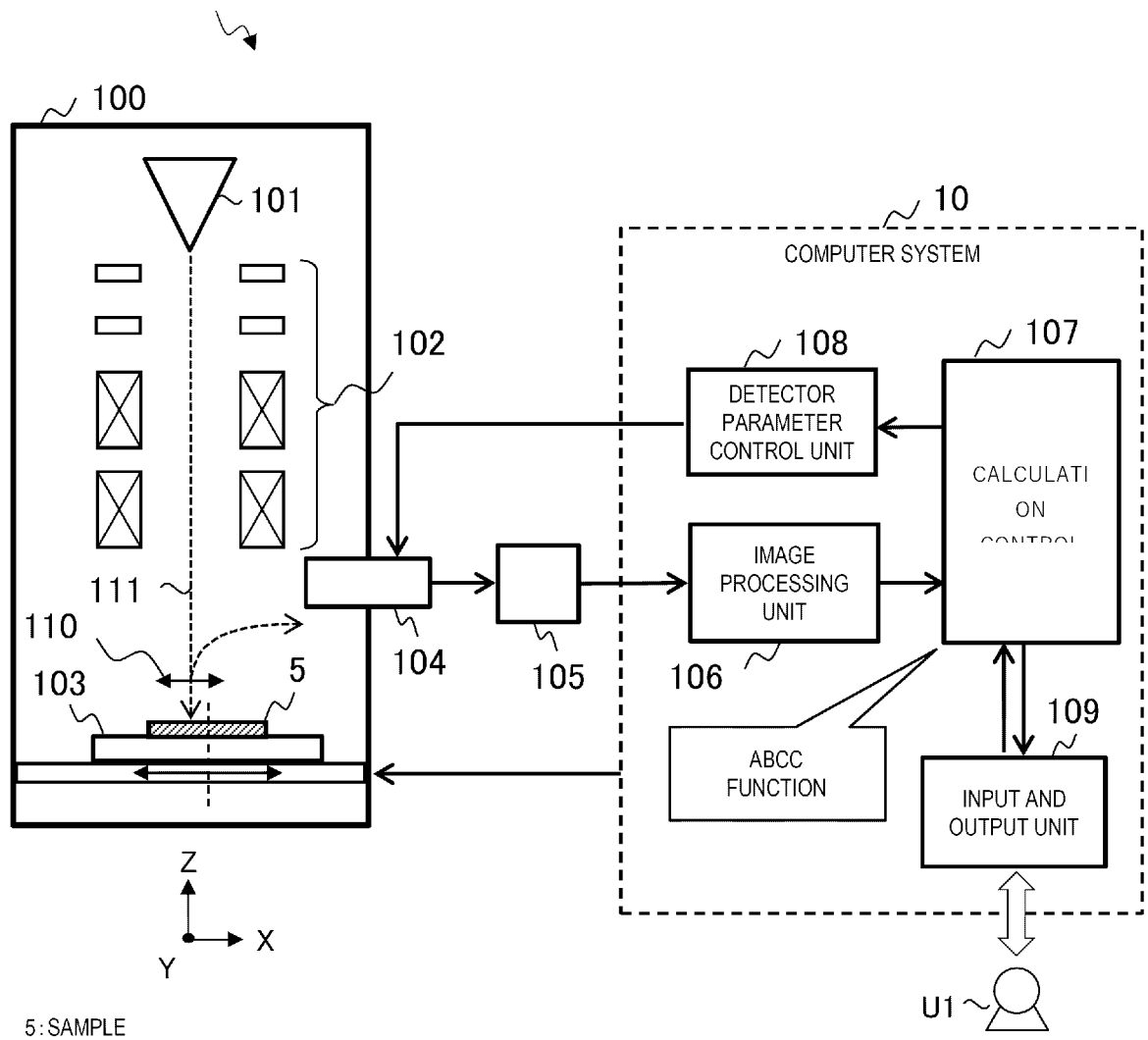

[FIG. 2]
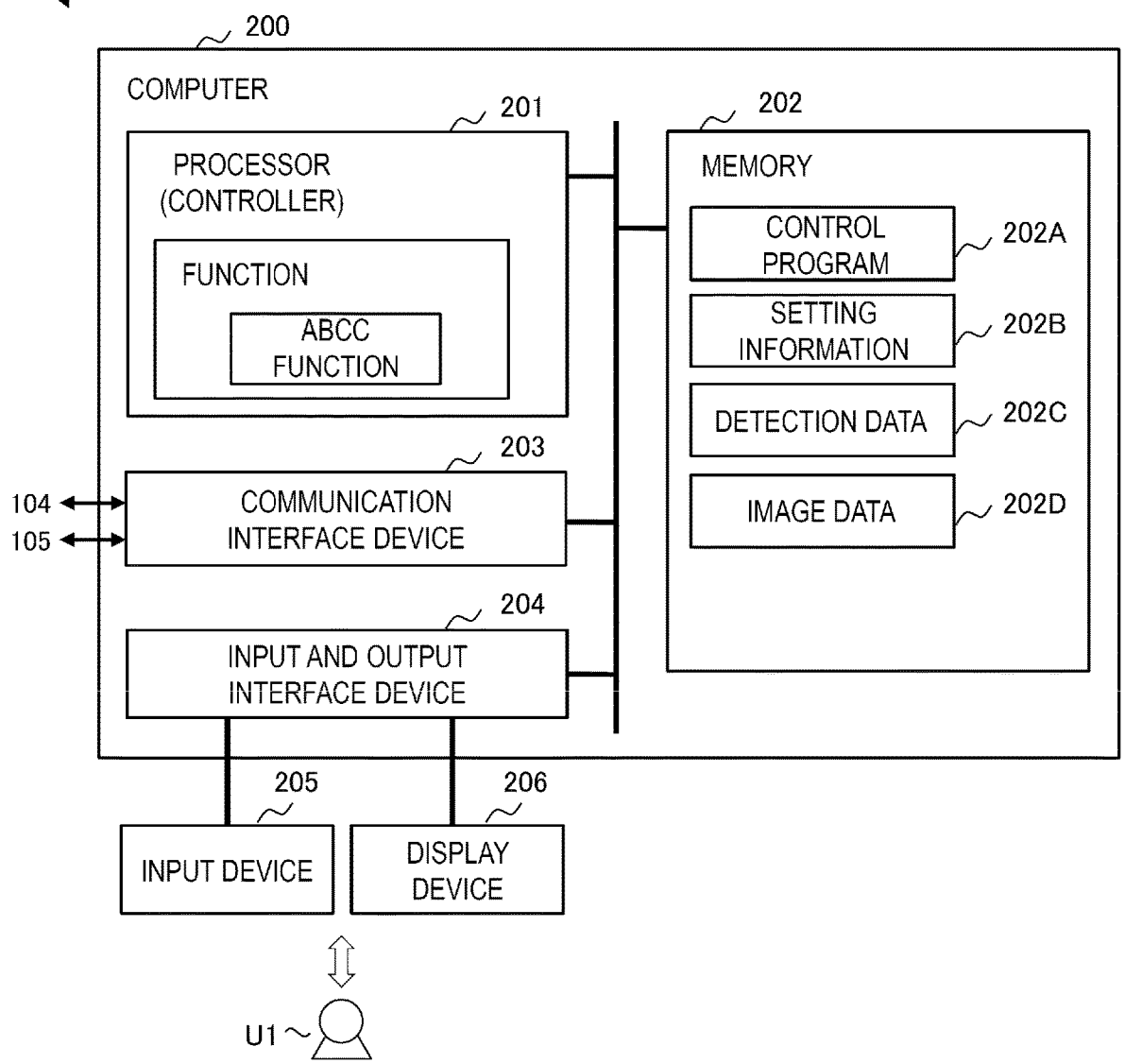

[FIG. 3]
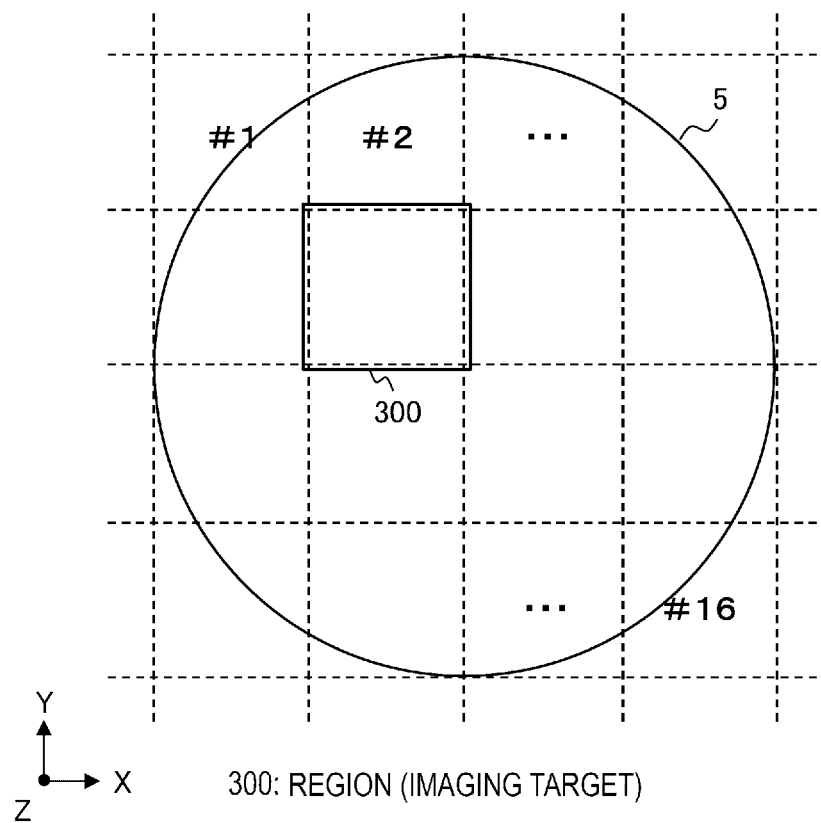
300: REGION (IMAGING TARGET)

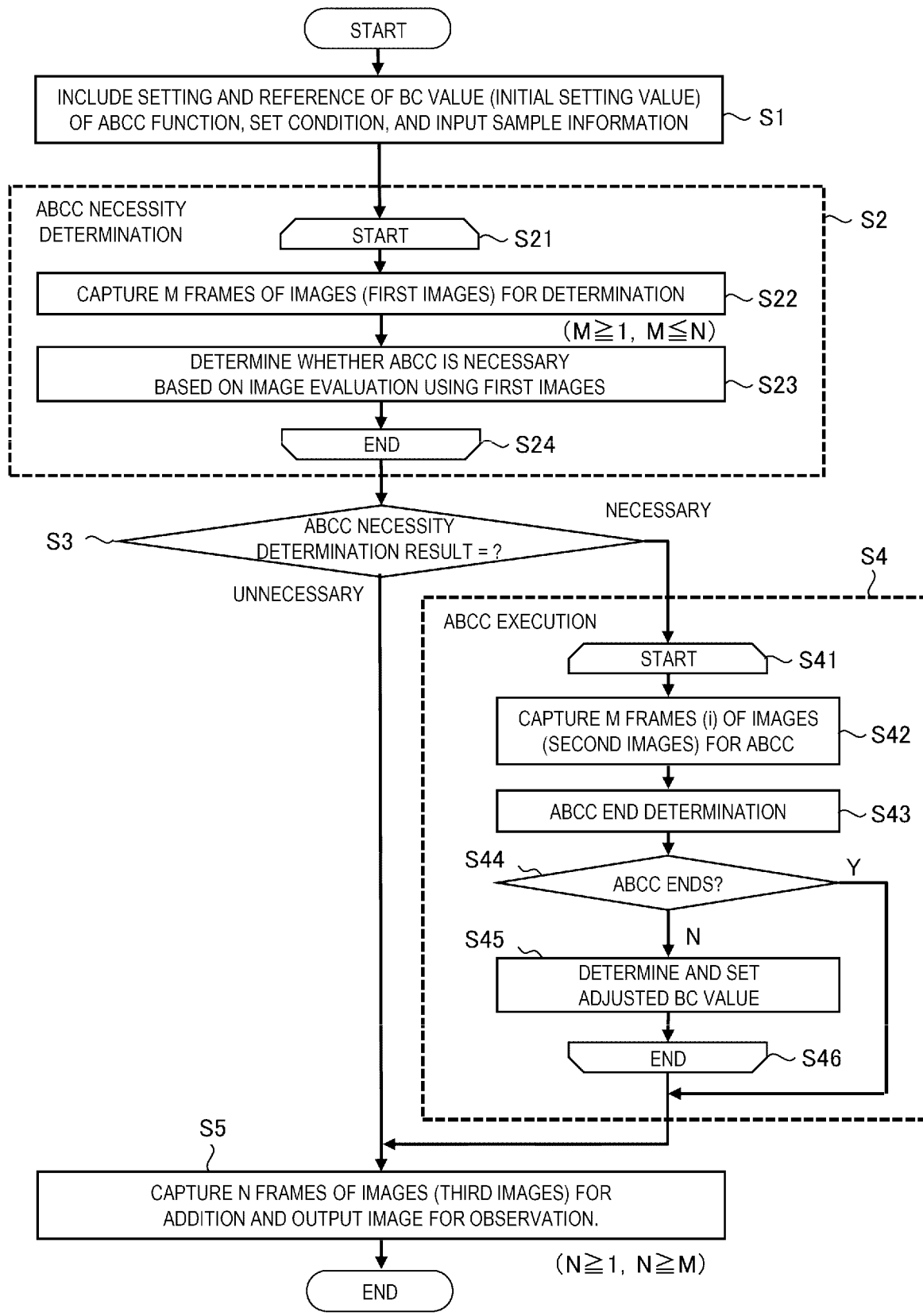
[FIG. 5]

FIG. 8A  SETTING SCREEN OF ABCC METHOD
FIG. 8B  DISPLAY SCREEN OF ABCC RESULT
FIG. 8C  STORED BC VALUE LIST
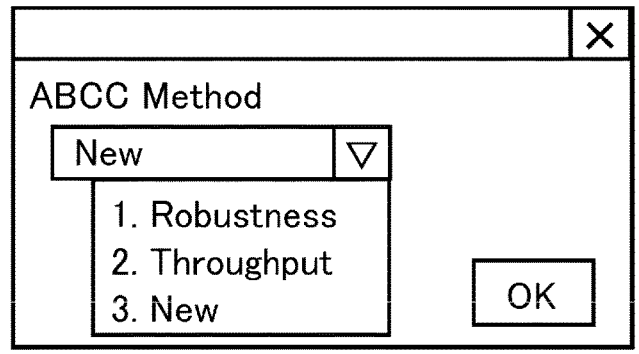

FIG. 9A  FIRST METHOD (ROBUSTNESS PRIORITY METHOD)
| #1 | #2 | #3 | #4 | #5 | ... | #m |
|----|----|----|----|----|-----|-----|
| BC1 | BC2 | BC3 | BC4 | BC5 | ... | BCm |
FIG. 9B  SECOND METHOD (THROUGHPUT PRIORITY METHOD)
| #1 | #2 | #3 | #4 | #5 | ... | #m |
|----|----|----|----|----|-----|-----|
| BC1 | BC1 | BC1 | BC1 | BC1 | ... | BC1 |
FIG. 9C  METHOD OF FIRST EMBODIMENT
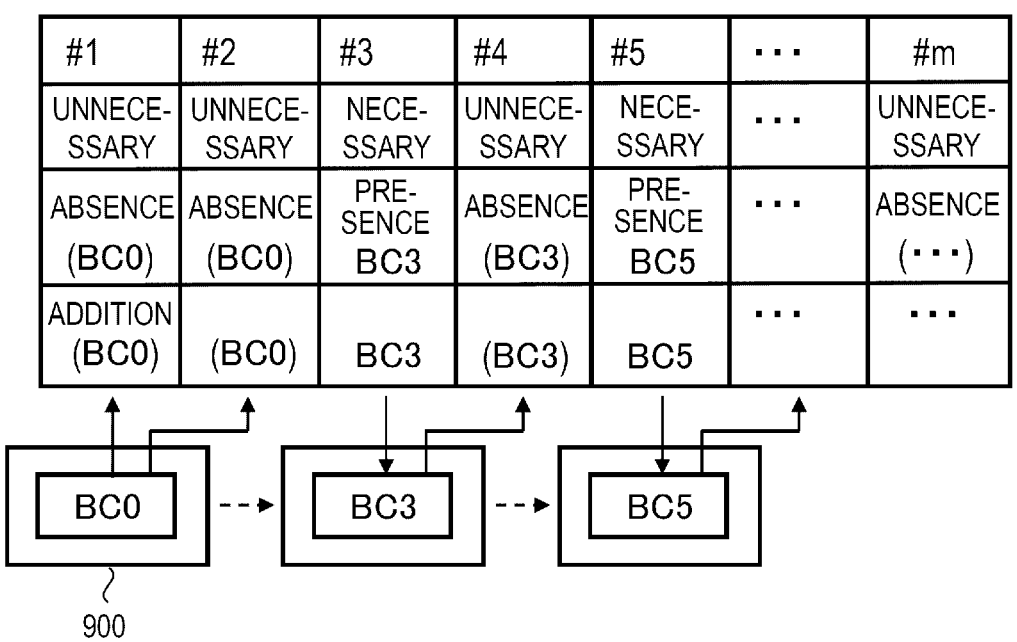

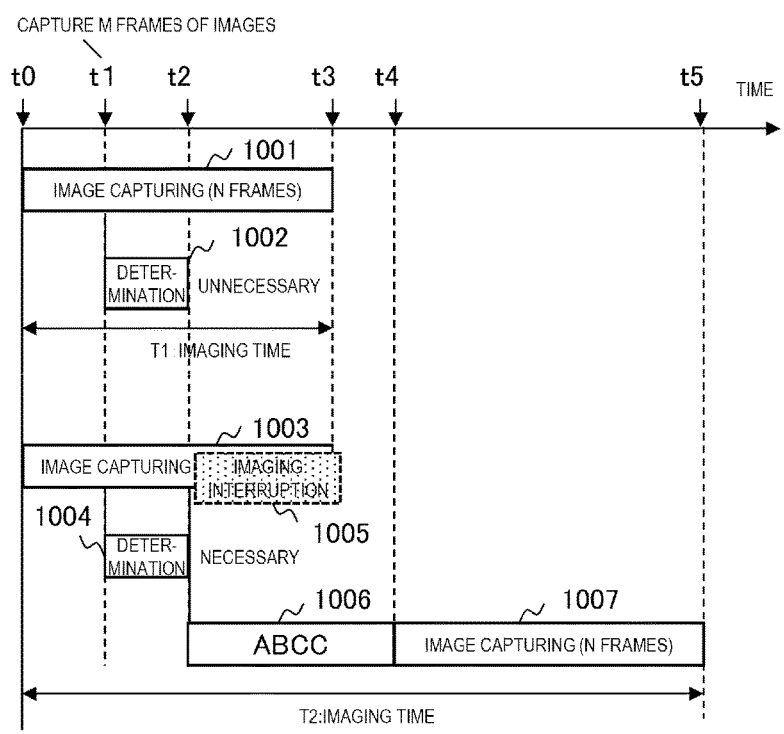

[FIG. 11]
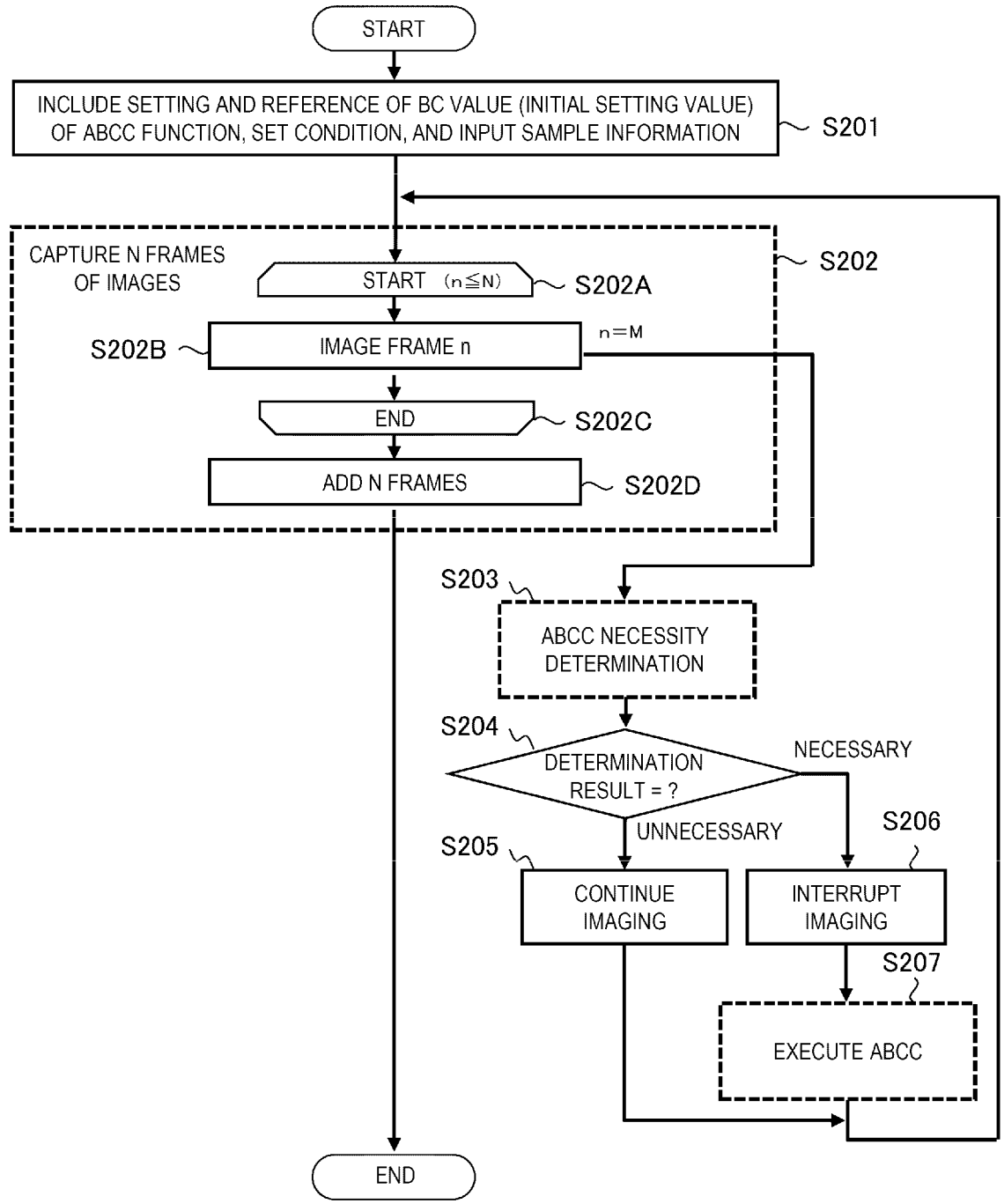

[FIG. 12]
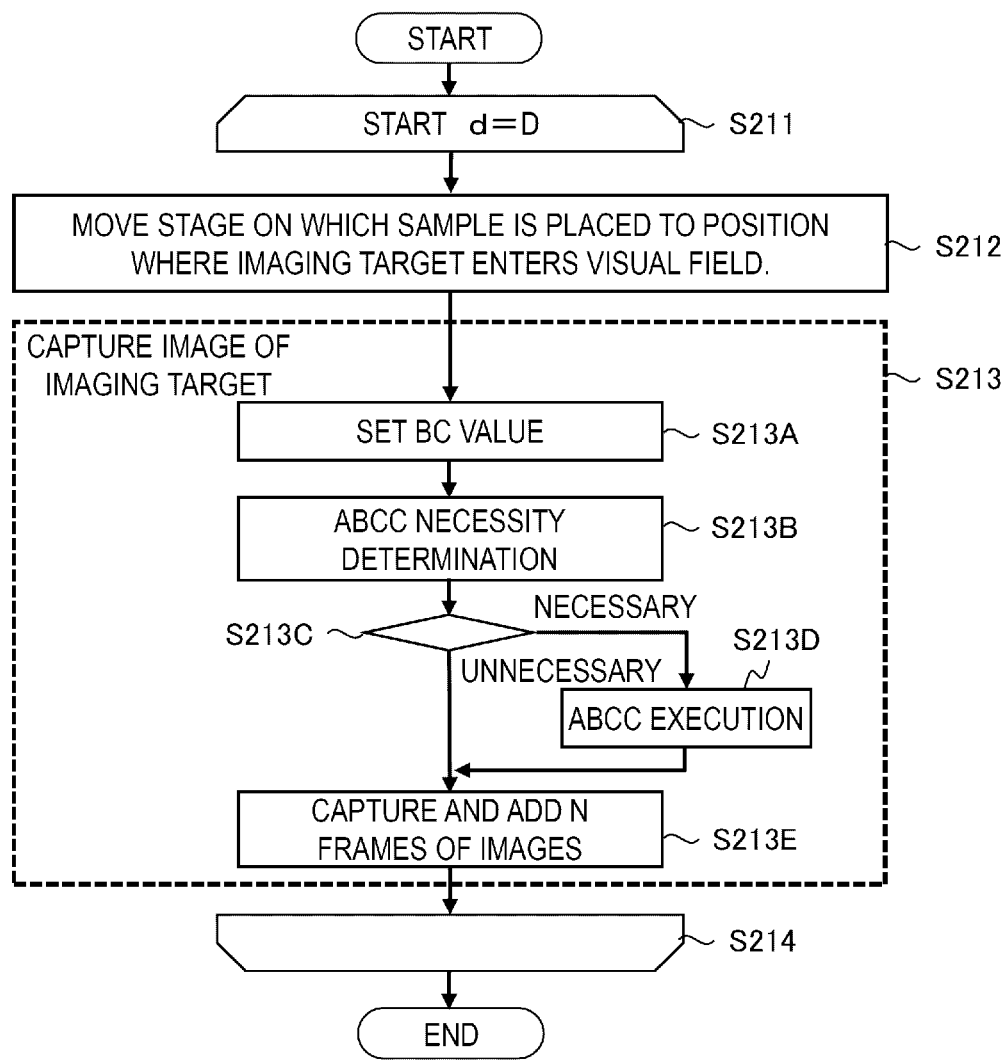

[FIG. 13]
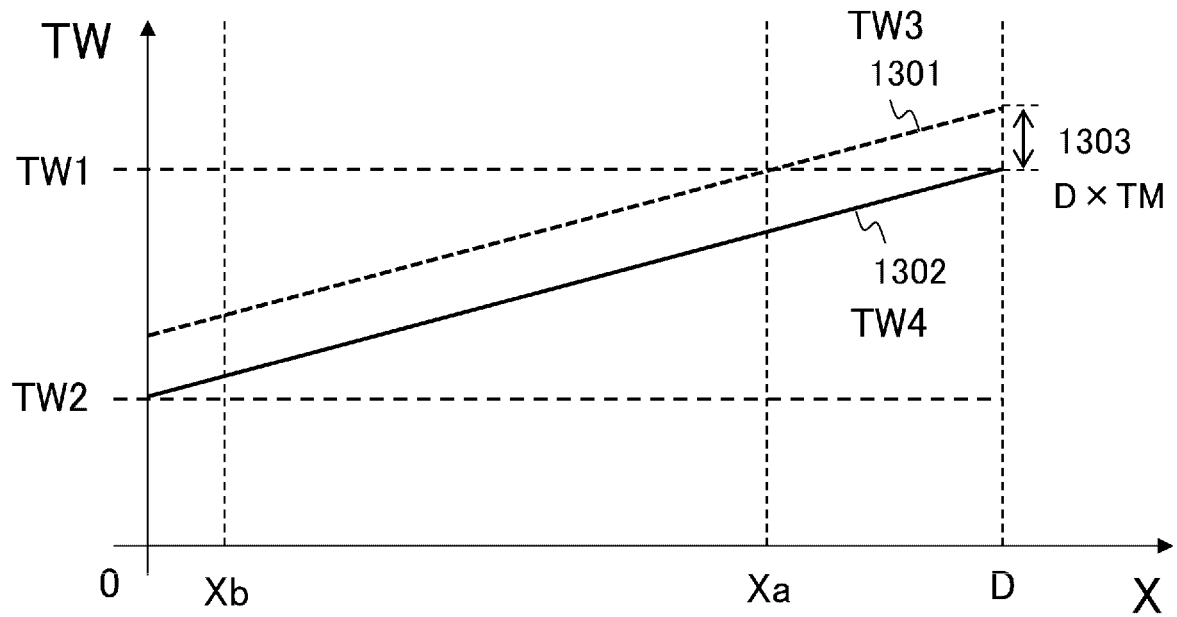
<PROCESSING TIME: TW>
FIRST METHOD:      TW1 = D × (TN + TS + TA)
SECOND METHOD:     TW2 = D × (TN + TS) + TA
FIRST EMBODIMENT:  TW3 = D × (TN + TS + TM) + X × TA
SECOND EMBODIMENT: TW4 = D × (TN + TS) + X × TA

[FIG. 14]
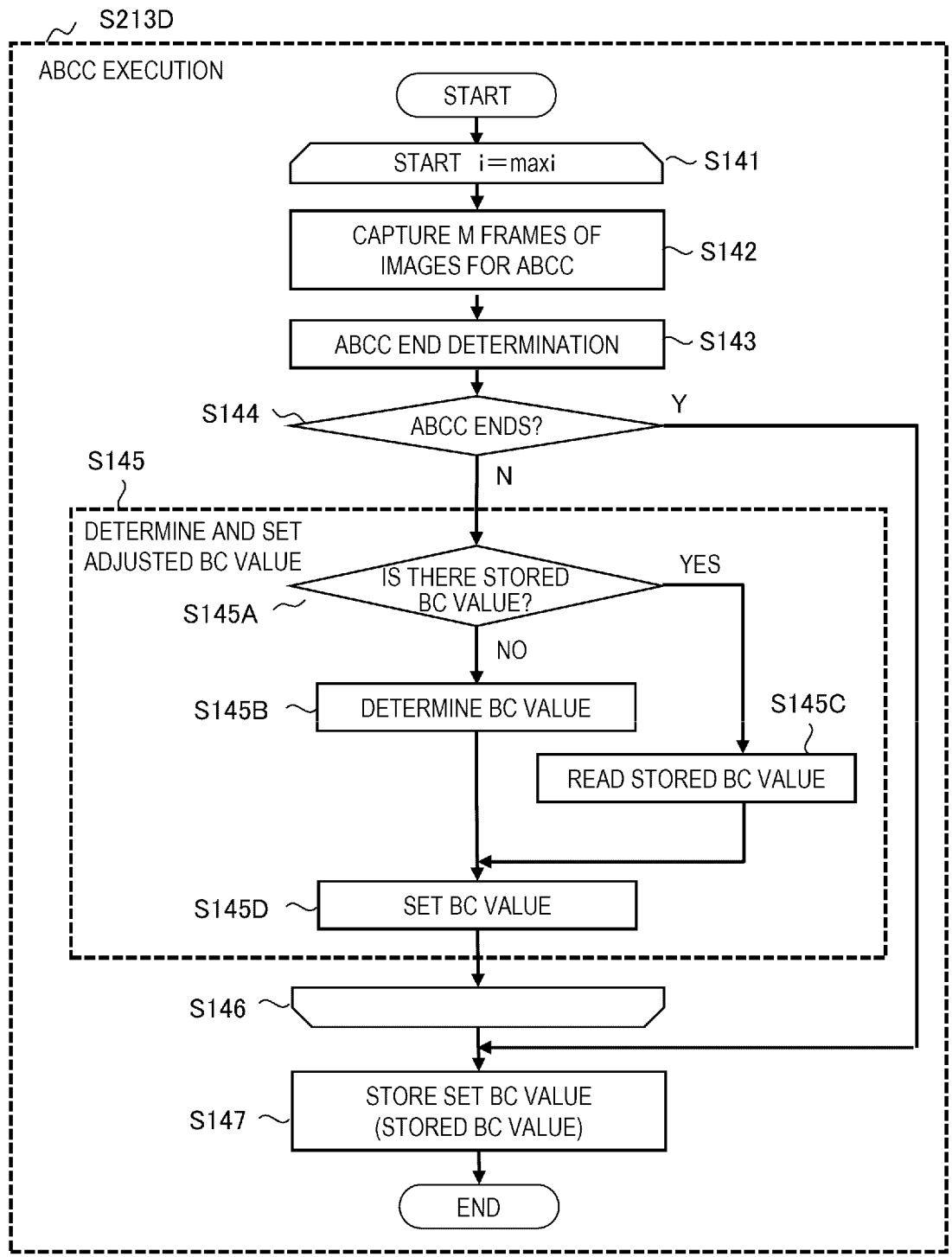

FIRST SAMPLE (WAFER W1)

ABCC RESULT

| IMAGING TARGET | INITIAL SETTING VALUE | | AFTER ADJUSTMENT | |
|---|---|---|---|---|
| | B | C | B | C |
| W1—#1 | b1 | c1 | b1x | c1x |
| W1—#2 | b1 | c1 | b1x | c1x |
| ... | ... | ... | ... | ... |
| W1—#16 | b1 | c1 | b1x | c1x |
| ... | ... | ... | ... | ... |

SECOND SAMPLE (WAFER W2)

ABCC

| IMAGING TARGET | AFTER RE-EXECUTION | |
|---|---|---|
| | B | C |
| W2—#1 | b1x | c1x |
| W2—#2 | b1x | c1x |
| ... | ... | ... |
| W2—#16 | b1x | c1x |
| ... | ... | ... |

[FIG. 16]
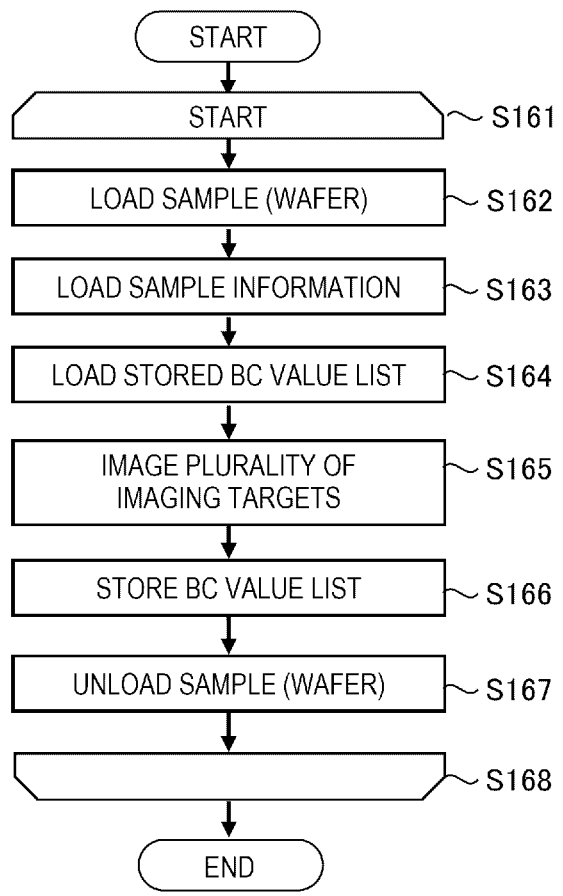

[FIG. 17]

| IMAGING TARGET (ID) | SAMPLE | MANUFAC-TURING DEVICE | MANUFAC-TURING PROCESS | STORED BC VALUE ||  CONDITION |
|---|---|---|---|---|---|---|
| | | | | B | C | |
| 1001 | W01 | Dev1 | Pro1 | b1 | c1 | p11,p12,··· |
| 1002 | W01 | Dev1 | Pro1 | b1 | c1 | p11,p12,··· |
| ··· | ··· | ··· | ··· | ··· | ··· | ··· |
| 2001 | W02 | Dev2 | Pro2 | b2 | c2 | p21,p22,··· |
| 2002 | W02 | Dev2 | Pro2 | b2 | c2 | p21,p22,··· |
| ··· | ··· | ··· | ··· | ··· | ··· | ··· |
| 3001 | W03 | Dev1 | Pro1 | — | — | p11,p12,··· |
| ··· | ··· | ··· | ··· | ··· | ··· | ··· |
| | | | | | | |

[FIG. 18]
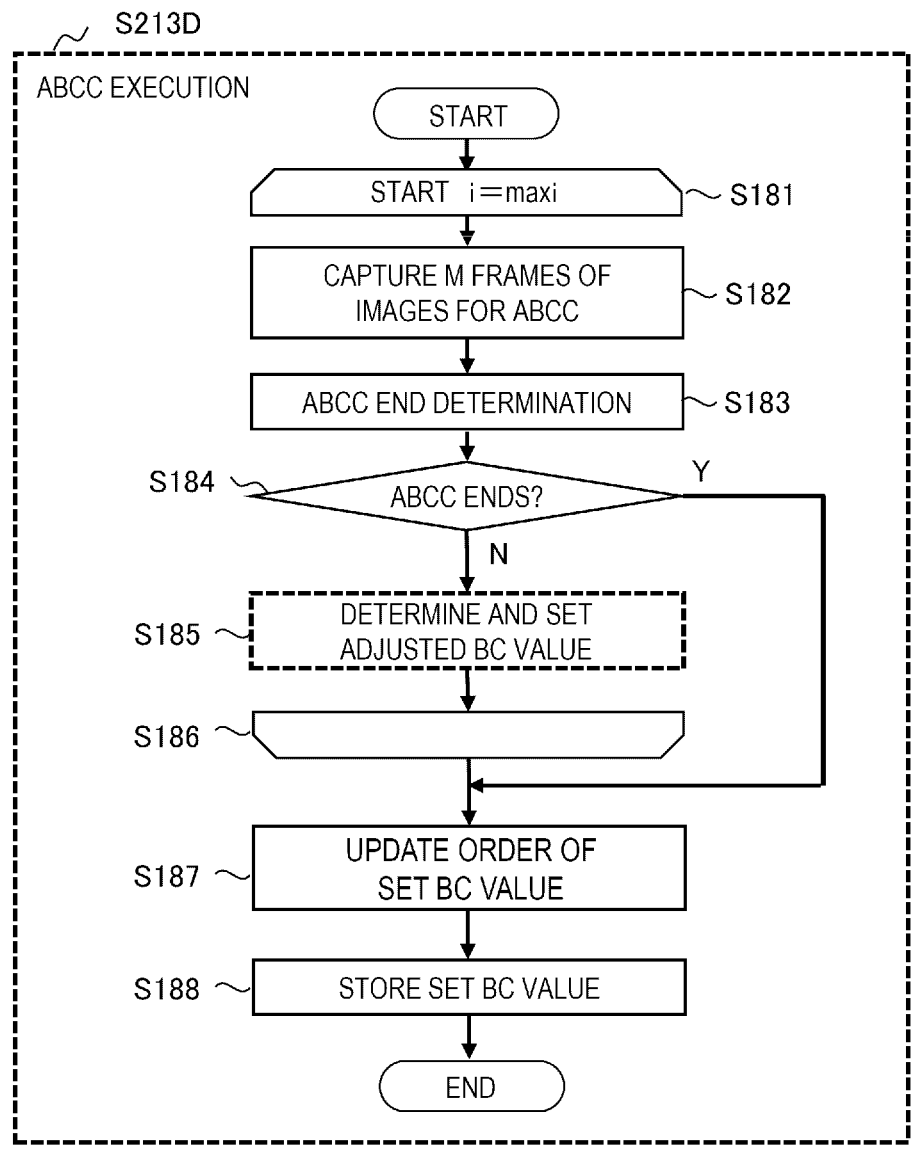

FIG. 19A  STORED BC VALUE HISTORY INFORMATION

| DATE AND TIME | STORED BC VALUE | | CONDITION (PARAMETER) | SAMPLE INFORMATION |
|---|---|---|---|---|
| | B | C | | |
| 2020/6/1 | b1 | c1 | p11,p12,··· | Dev1,Pro1 |
| 2020/6/2 | b2 | c2 | ······ | ······ |
| 2020/6/3 | b3 | c3 | ······ | ······ |
| 2020/6/4 | b2 | c2 | ······ | ······ |
| 2020/6/5 | b4 | c4 | ······ | ······ |
| ··· | ··· | ··· | ······ | ······ |

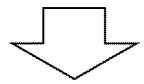

FIG. 19B  STORED BC VALUE EXECUTION FREQUENCY INFORMATION

| ORDER (PRIORITY) | STORED BC VALUE | | CONDITION (PARAMETER) | EXECUTION FREQUENCY (NUMBER OF TIMES OF EXECUTION) |
|---|---|---|---|---|
| | B | C | | |
| 1 | b2 | c2 | p21,p22,··· | n1 |
| 2 | b4 | c4 | ······ | n2 |
| 3 | b1 | c1 | ······ | n3 |
| ··· | ··· | ··· | ······ | ······ |
| | | | | |

CHARGED PARTICLE BEAM DEVICE

TECHNICAL FIELD

The present invention relates to a technique of a charged particle beam device, and relates to a captured image processing technique.

BACKGROUND ART

Examples of a charged particle beam device include a scanning electron microscope (SEM). The SEM is a device having a function of irradiating and scanning a fine object which is a sample with an electron beam, detecting signal electrons emitted from the sample with a detector, and performing observation, inspection, dimension measurement, and the like on the sample based on a detection signal. The sample is, for example, a wafer to be imaged. On a surface of the sample, there is a pattern such as unevenness due to a difference in a height. On the surface of the sample, there are a plurality of imaging targets (in other words, imaging regions) corresponding to a visual field and a position of imaging. In the SEM, for example, a defective portion is observed and detected from a captured image.

In the charged particle beam device, one of adjustments when the image is generated based on the detection signal includes an adjustment of a contrast and a brightness of the image. Further, an example of a function of automatically adjusting the brightness and the contrast of the image includes an auto brightness contrast control (ABCC) function.

An example of the related art according to the above includes JP-A-2007-329081 (PTL 1). PTL 1 discloses that a device which flexibly supports imaging targets having various pattern densities and has a brightness and contrast adjusting function capable of always capturing an image having an optimum brightness and contrast is provided as the charged particle beam device.

CITATION LIST

Patent Literature

PTL 1: JP-A-2007-329081

SUMMARY OF INVENTION

Technical Problem

The ABCC function in the charged particle beam device in the related art, in other words, the technique of adjusting the brightness (represented by a symbol B in some cases) and the contrast (represented by a symbol C in some cases) of the captured image includes the following first method and second method.

The first method is an example as disclosed in PTL 1. In the first method as disclosed in PTL 1, the ABCC is performed on all imaging targets among a plurality of imaging targets that can have various pattern densities. Accordingly, images suitable for the imaging targets having various pattern densities can be obtained. That is, in the first method, a height of robustness is ensured, which is advantageous from a viewpoint of the robustness. In other words, the robustness can flexibly cope with various changing inputs. However, in the first method, since the ABCC is performed on each imaging target each time, processing time is required, and throughput of the device, in other words, temporal processing efficiency may be low.

In the second method, the ABCC is performed, only at a time of imaging, on a first imaging target among a plurality of imaging targets of the sample, and an adjusted B value and C value (which may be collectively referred to as a BC value) obtained by the ABCC is applied to each of subsequent imaging targets. The second method is advantageous in that the throughput can be increased as compared to the first method because the number of times the ABCC is performed and the processing time are reduced. However, in the second method, due to a difference in pattern density of the imaging target, an appropriate gradation value (corresponding BC value) may not be set, that is, an image for observation in which the imaging target is appropriately displayed may not be acquired. The second method is insufficient from a viewpoint of robustness that can cope with the difference in pattern density when the imaging is executed under a condition (corresponding recipe) of the imaging of the sample.

In the pattern on the surface of the sample, the plurality of imaging targets may have a large difference in pattern density, or may have a difference in presence or absence of the defect and a state of degree. In these cases, for example, the B value (corresponding gradation value) may be saturated in the captured image. Regarding this point, in a case of the first method, since it tends to obtain an image having no saturation, the robustness is high, but the throughput is low, and in a case of the second method, although the throughput is high, the robustness is low since it tends to obtain an image having saturation.

An object of the invention is to provide a technique capable of achieving both throughput and robustness in a balanced manner in a function of adjusting brightness and contrast of a captured image in a charged particle beam device.

Solution to Problem

A representative embodiment of the present disclosure includes the following configuration. A charged particle beam device according to an embodiment includes a computer system having a function of adjusting brightness and contrast of an image obtained by imaging a sample. The computer system is configured to determine whether the adjustment is necessary based on a result obtained by evaluating a first image obtained by imaging an imaging target of the sample, and when the adjustment is necessary based on a result of the determination, execute the adjustment on a second image of the imaging target to set an adjusted brightness value and an adjusted contrast value and capture a third image of the imaging target based on the adjusted setting values to generate an image for observation, and when the adjustment is unnecessary, capture the third image of the imaging target based on setting values before the adjustment to generate the image for observation without executing the adjustment on the imaging target.

Advantageous Effect

According to representative embodiments of the present disclosure, both throughput and robustness can be achieved in a balanced manner for a function of adjusting the brightness and the contrast of the captured image in the charged

BRIEF DESCRIPTION OF DRAWINGS

FIG. 1 is a diagram showing a configuration of a charged particle beam device according to a first embodiment of the present disclosure.

FIG. 2 is a diagram showing a configuration example of a computer system according to the first embodiment.

FIG. 3 is a diagram showing an example of an imaging target of a sample according to the first embodiment.

FIG. 5 is a diagram showing a flow of main processing performed by the computer system according to the first embodiment.

FIGS. 8A-8C are diagrams showing an example of a GUI screen of the computer system according to the first embodiment.

FIGS. 9A-9C are explanatory diagrams related to an effect in the first embodiment.

FIGS. 10A and 10B are diagrams showing an outline and an example of parallel processing in a charged particle beam device according to a second embodiment of the present disclosure.

FIG. 11 is a diagram showing a flow of main processing of a computer system according to the second embodiment.

FIG. 12 is a diagram showing a flow in consideration of a plurality of imaging targets and stage movement regarding an effect of a method of the second embodiment.

FIG. 13 is a diagram showing a graph of estimation of a processing time regarding effects of the second embodiment and each method.

FIG. 14 is a diagram showing a flow of processing of a computer system in a charged particle beam device according to a third embodiment of the present disclosure.

FIG. 16 is a diagram showing a flow of processing performed by a computer system in a charged particle beam device according to a fourth embodiment of the present disclosure.

FIG. 17 is a diagram showing a configuration example of a table for managing sample information and the like according to the fourth embodiment.

FIG. 18 is a diagram showing a flow of processing of a computer system in a charged particle beam device according to a fifth embodiment of the present disclosure.

FIGS. 19A and 19B are diagrams showing a configuration example of a table for managing information including execution frequency of a BC value according to the fifth embodiment.

DESCRIPTION OF EMBODIMENTS

Figure 4A:
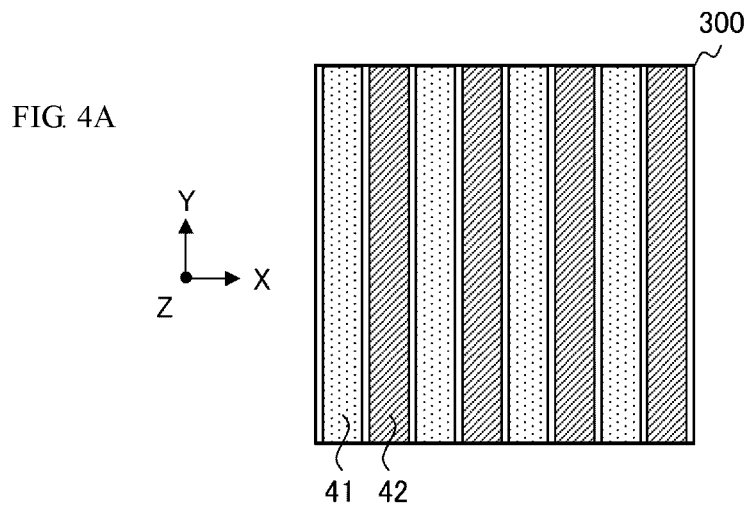
FIGS. 4A-4C are diagrams showing an example of a difference in pattern density of the imaging target according to the first embodiment.

Hereinafter, embodiments of the present disclosure will be described in detail with reference to drawings. In all the drawings, the same parts are denoted by the same reference numerals in principle, and a repeated description thereof will be omitted.

First Embodiment

A charged particle beam device according to a first embodiment of the present disclosure will be described with reference to FIGS. 1 to 9. A method related to an ABCC function in the first embodiment is a new method obtained by combining the first method and the second method described above in order to achieve both superiority of robustness of the first method and superiority of throughput of the second method.

The charged particle beam device according to the first embodiment determines whether execution of the ABCC is necessary before capturing an image of an imaging target of a target sample, and when the ABCC is "necessary" as a result, the ABCC is executed on the imaging target thereafter. That is, the charged particle beam device adjusts a BC value to a suitable BC value by the ABCC, and sets (in other words, updates or resets) the adjusted BC value. Then, the charged particle beam device captures an image for observation using the adjusted BC value.

[Processing Outline]

A processing outline in the first embodiment is as follows. A charged particle beam device 1 shown in FIG. 1 and the like uses, for each imaging target of a sample 5, a BC value, which is an initial setting value of the ABCC function and is set and stored in advance, to capture, for example, M frames of images (first images) under a condition including the BC value. The condition is an imaging and detection condition, and includes, for example, a detector parameter. The charged particle beam device 1 performs image evaluation processing using the first images, and determines whether the ABCC is to be performed on the imaging target based on an evaluation result thereof. A content of the image evaluation processing is not limited, and for example, determination of saturation, which will be described later, using a gradation histogram is described as an example. For example, when there is no saturation, the charged particle beam device 1 determines that the ABCC is "unnecessary", and when there is saturation, the charged particle beam device 1 determines that the ABCC is "necessary".

When the ABCC is "necessary", the charged particle beam device 1 captures, for example, M frames of images (second images) for the ABCC of the imaging target under the condition including the BC value. The charged particle beam device 1 determines whether to end the ABCC processing based on the determination of the saturation of the gradation value of the image. When the BC value is adjusted to a suitable BC value by the ABCC, the charged particle beam device 1 stores the adjusted BC value as a new setting value related to the ABCC function. Then, the charged particle beam device 1 captures, for example, N frames of images (third images) for addition processing of the imaging target under an adjusted condition including the adjusted BC value obtained by the ABCC, generates the image for observation based on the captured images, and outputs the image for observation to a user.

[Charged Particle Beam Device]

FIG. 1 shows a configuration of the charged particle beam device 1 according to the first embodiment. The first embodiment describes a case where the charged particle beam device 1 is applied to an SEM. The SEM is, in other words, a wafer observation device. The SEM, which is the charged particle beam device 1 according to the first embodiment, includes a housing 100 and a computer system 10, which are electrically connected to each other. An electron beam source 101, an electron optical system 102, a stage 103, a detector 104, and the like are provided in the housing 100. An analog-to-digital converter 105 is connected to the detector 104. The analog-to-digital converter 105 is connected to the computer system 10. Further, the detector 104 is connected to a detector parameter control unit 108 of the computer system 10.

The computer system. 10 is a system that controls the charged particle beam device 1, and corresponds to a controller of the charged particle beam device 1. The computer system 10 controls driving of each unit (including the stage 103 and the detector 104) in the housing 100 of the charged particle beam device 1.

The computer system 10 includes, as functional blocks, a calculation control unit 107, an image processing unit 106, the detector parameter control unit 108, an input and output unit 109, and the like. A user U1, who is an operator, operates the input and output unit 109 of the computer system 10 to use the charged particle beam device 1. The computer system 10 provides the user U1 with a user interface including a graphical user interface (GUI). The input and output unit 109 includes an input device, a display device, and the like. The user U1 can see the image for observation and various kinds of information on a display screen provided by the computer system 10.

The housing 100 is configured with an airtight chamber. The stage 103 and the like are provided in the airtight chamber. On the stage 103, the sample 5 transferred and loaded from an outside is placed and held. The sample 5 is, for example, a silicon wafer, and a pattern corresponding to a manufacturing process (for example, etching or film formation) is formed on the sample 5. The sample 5 is a sample for manufacturing a manufacturing object (described as a manufacturing device) such as a semiconductor device. The sample 5 is disposed at a position corresponding to a visual field 110 based on movement of the stage 103. The visual field 110 shows an example of a certain visual field (corresponding range) at a time of imaging.

The stage 103 in the airtight chamber can be moved, for example, in each direction (X and Y directions in the drawing) in a horizontal direction by a stage moving mechanism (not shown) based on drive control from the computer system 10. The computer system 10 disposes a desired position on a surface of the sample 5 to correspond to the visual field 110 by movement control on the stage 103, so as to set the desired position as the imaging target.

The charged particle beam device 1 generates an electron beam 111 from the electron beam source 101, and irradiates the imaging target on the surface of the sample 5 on the stage 103 with the electron beam 111 such that the electron beam 111 is converged to scan the imaging target under control such as deflection performed by the electron optical system 102. The electron optical system 102 includes, for example, an electron lens and a coil. The scanning can be performed in each direction (X and Y directions) in a plane of the sample 5. Secondary electrons and the like generated from the surface of the sample 5 in response to the irradiation of the electron beam 111 are detected by the detector 104. A detection signal, which is an analog signal detected by the detector 104, is converted into a digital signal by the analog-to-digital converter 105, and is transmitted to the image processing unit 106 of the computer system 10.

The image processing unit 106 of the computer system 10 processes the detection signal to generate the image. The calculation control unit 107 performs processing related to the ABCC function and the like on the image. The calculation control unit 107 generates the image for observation based on the addition processing and the like of the image, and outputs the image for observation to the user U1 through the input and output unit 109. Further, when the calculation control unit 107 performs control related to the ABCC function, the calculation control unit 107 controls the detector parameter control unit 108. The calculation control unit 107 controls and sets a condition related to the imaging and the detection including the detector parameter. Details of the condition are not limited. The detector parameter control unit 108 sets a parameter related to the detection of the detector 104. The parameter is a parameter that affects a B value and a C value of the captured image. Examples of the detector parameter include a voltage of a photomultiplier tube constituting the detector 104. The BC value of the ABCC function has a predetermined correspondence relationship with such a detector parameter. The charged particle beam device 1 grasps the correspondence relationship. Control on the BC value of the ABCC function is, in other words, control on the detector parameter.

The charged particle beam device 1 implements the ABCC function mainly based on program processing performed by the computer system 10. Examples of a use of the ABCC function include detecting a defective portion by observing the surface of the sample 5 and obtaining the image for observation having the suitable B value and C value in order to implement highly accurate dimension measurement. When the processing related to the ABCC function is performed on the sample 5, the charged particle beam device 1 performs the ABCC necessity determination by the computer system 10 before imaging the image of the imaging target, when it is determined that the ABCC is "necessary", executes the ABCC on the imaging target, resets the adjusted BC value, and then captures the image for observation.

[Computer System]

FIG. 2 shows a configuration example of the computer system 10. The computer system 10 is configured with a computer 200 and an input device 205 and a display device 206 which are connected to the computer 200. The computer 200 is configured with a processor 201, a memory 202, a communication interface device 203, an input and output interface device 204, and a bus connecting the parts one another. The input device 205 such as a keyboard and a mouse, and the display device 206 such as a liquid crystal display are connected to the input and output interface device 204. The communication interface device 203 is connected to each unit such as the detector 104 and analog-to-digital converter 105 of the charged particle beam device 1 of FIG. 1 via a signal line, and inputs and outputs a signal to or from or communicates with each unit. Further, the communication interface device 203 may be connected to an external device (for example, a server) via a predetermined communication interface (for example, an LAN) to communicate with the external device.

The processor 201 is configured with, for example, a CPU, an ROM, an RAM, and the like, and constitutes a controller of the computer system 10. The processor 201 implements a function of the computer system 10 based on software program processing. The function includes the ABCC function. The function may be implemented not only by the software program processing but also by a dedicated circuit.

The memory 202 is configured with a nonvolatile storage device and the like, and stores various data and information to be used by the processor 201. The memory 202 stores a control program 202A, setting information 202B, detection data 202C, and image data 202D. The control program 202A is a program for implementing the function. The setting information 202B is setting information on the control program 202A and setting information from the user U1. The setting information 202B includes information such as the BC value of the ABCC function. The detection data 202C is data corresponding to the detection signal obtained from the detector 104. The image data 202D is data of the image obtained based on the detection data 202C, and includes data of various images corresponding to respective processing stages. The image data 202D includes data of the image for observation to be output to the user U1.

[Example of Imaging Target of Sample]

FIG. 3 shows an example of the imaging target of the sample 5. FIG. 3 is a schematic view of the sample 5 on the stage 103 in FIG. 1 on a horizontal plane (corresponding to an X-Y plane). In the present example, there is one circular wafer as the sample 5, and a region of a surface of the wafer is divided into rectangular regions 300 each having a certain size. The region 300 corresponds to one imaging target (corresponding imaging region). One region 300 is associated with the visual field 110 of FIG. 1. The entire wafer has a plurality of imaging targets, and in the present example, and there are the plurality of imaging targets (#1 to #16) in one wafer. The region 300 of each imaging target is not limited to having the same pattern density, and the defective portion may be generated in accordance with the manufacturing process. The invention is not limited to the present example, and the plurality of imaging targets can be similarly configured when there are a plurality of samples 5.

The imaging target is, in other words, an object or the imaging region associated with the set condition, the visual field 110, and a position of the stage 103. The visual field 110 and a position of the imaging are associated with the position of the stage 103 holding the sample 5. When imaging a plurality of imaging targets many times, the charged particle beam device 1 performs control so as to change the position of the stage 103 in each time.

In each embodiment, the pattern density and a defect state of the surface of the sample 5 can be handled. The defect refers to a large difference from a state of a reference pattern shape designed in advance in the sample 5. The defect is not intended in a design, and is, for example, a portion generated in the manufacturing process.

Although FIG. 3 shows a case where the imaging is performed by dividing the entire region of the surface of the wafer into a plurality of regions, the invention is not limited thereto, and a partial region (for example, only a region including the defective portion) of the surface of the wafer may be set as the imaging target. The partial region can be freely set by the computer system 10.

[Examples of Pattern Density of Imaging Target]

Figure 4B:
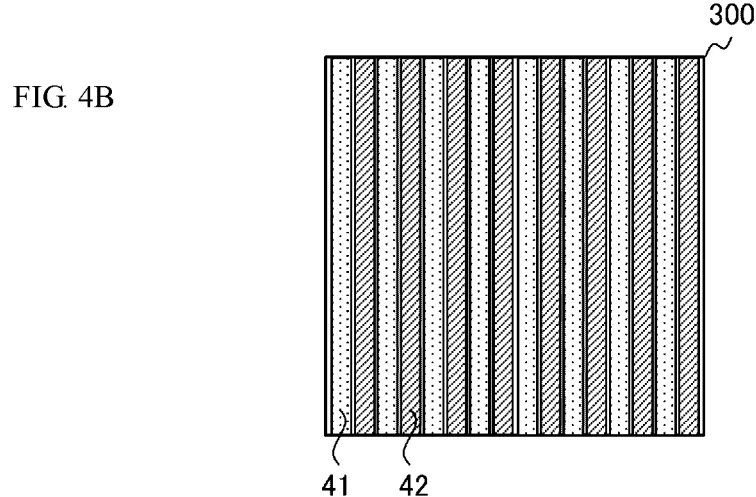

FIG. 4 shows examples of a shape and a density of a pattern in the imaging target (corresponding region 300) of the surface of the sample 5. In the present example, an LSI has a general line-and-space pattern on the surface of the sample 5. The pattern has, for example, a shape in which a difference in height is repeated like unevenness in an X direction. For example, a portion 41 has a first height, and a portion 42 has a second height lower than the first height. FIG. 4(A) shows a case where the pattern density is relatively small as compared to FIG. 4(B), and FIG. 4(B) shows a case where the pattern density is relatively large as compared to FIG. 4(A).

Figure 4C:
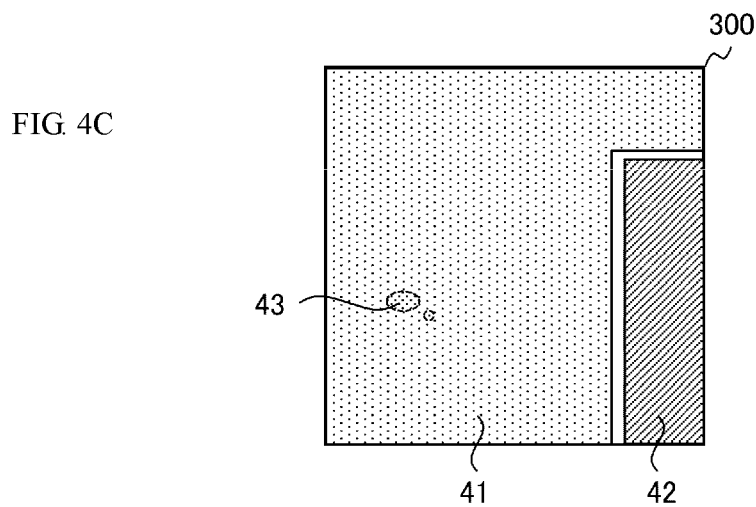

FIG. 4(C) shows an example where the pattern density is further smaller than that of FIG. 4(A). In the region 300, a large area is the portion 41, and a part of the area is the portion 42. Further, for example, the portion 41 includes a defective portion 43 whose height is partially different. The defective portion 43 has a height different from, for example, a design value.

In the examples of FIGS. 4(A), 4(B), and 4(C), the pattern density is different among the imaging targets. Regarding this, in the related art, when the ABCC is applied under the same condition, a suitable image that is easy to see is not always obtained. Depending on the imaging target, an image may be difficult to see as a result of applying the ABCC at a certain BC value.

For example, in a case where a difference in B value (corresponding gradation value) between the portion 41 and the portion 42 is small in the image of the imaging target in FIG. 4(A), when the difference is adjusted to be widened as a result of the adjustment of the ABCC, an image that is easy to see and has a high contrast can be obtained. However, when the ABCC with the same condition is applied to the image of the imaging target as in FIG. 4(C), it is not always possible to obtain an image that is easy to see. For example, there is a possibility that the defective portion such as the portion 43 is difficult to see and is difficult to detect.

As also described in PTL 1, the charged particle beam device 1 may calculate the pattern density of the region that is the imaging target on the surface of the sample 5 and use the calculated pattern density for control.

[Processing Flow]

FIG. 5 shows a flow of main processing performed by the computer system 10 in the charged particle beam device 1 according to the fifth embodiment. The flow of FIG. 5 includes steps S1 to S5. Step S1 is a step of setting an initial setting value of the BC value of the ABCC function or a step of referring to the initial setting value. Step S1 may be regarded as a step of setting or referring to not only the BC value but also, broadly speaking, a parameter value of the ABCC function. The initial setting value of the BC value is a BC value that is to be applied to the imaging target for a first time.

Step S1 includes setting of setting of the BC value, and includes setting of the imaging and detection condition of the charged particle beam device 1. The setting of the condition includes at least setting of the parameter of the detector 104. The set various kinds of information are held as a part of the setting information 202B of the memory 202 of FIG. 2.

Further, step S1 includes input or setting of information (collectively referred to as sample information) on the plurality of imaging targets of the sample 5. The input or setting of the sample information is input or setting of information on the plurality of imaging targets (for example, FIG. 3) in the sample 5 (which may be one or a plurality of samples) to be processed. The input or setting may be automatically performed by the computer system 10 (for example, may be referred to information from a manufacturing management system), or may be appropriately input and set by the user U1. The sample information includes, for example, information such as an ID for identifying each of the plurality of imaging targets, an ID for identifying the manufacturing device and the manufacturing process of the sample 5, and the like. Further, the sample information may include information on a pattern to be imaged. For example, when a type of the pattern is defined in advance, the information may be information for identifying the type of the pattern, or when the pattern density is known based on calculation, the information may be information on the pattern density. In addition, the user U1 may freely set the information such as a comment.

Step S2 is a step of performing the ABCC necessity determination for the imaging target. Specifically, step S2 includes steps S21 to S24. Steps S21 and S24 are steps of conditions on a start and an end of loop processing of step S2. Step S21 represents the start of the loop processing for each image of the imaging target, and step S24 represents the end of the loop processing. When the processing on all the images of the imaging targets is completed, the process exits the loop, and step S2 is ended.

Step S22 is processing of capturing and acquiring a predetermined number (M) of image frames (first images described above) for the ABCC necessity determination. The number M is equal to or larger than 1, and is equal to or smaller than a number N of image frames for addition processing in step S5 to be described later (M≤N). The number M may be typically 1, but is not limited thereto, and may be equal to or larger than 2. When M frames of images are imaged in step S22, the condition including the BC value referred to in step S1 is used.

Step S23 is a step of determining whether the ABCC is necessary based on image evaluation processing using the M frames of first images acquired in step S22. An example of the image evaluation processing includes processing on saturation of a B value in FIG. 6, which will be described later. For example, when there is the saturation, it is determined that the ABCC is "necessary", and when there is no saturation, it is determined that the ABCC is "unnecessary".

Step S3 is a branch corresponding to an ABCC necessity determination result of step S2, proceeds to step S4 when the ABCC is "necessary", and proceeds to step S5 when the ABCC is "unnecessary".

Step S4 is a step of executing the ABCC on the imaging target. Specifically, step S4 includes steps S41 to S46. Steps S41 and S46 are steps of a start and an end of loop processing of step S4. The loop processing is repeated for each image of the M frames of images for the ABCC on the imaging target, and when the processing on a last image of the M frames is ended, step S4 is ended. The number M of image frames for ABCC in step S4 is the same as the number M of image frames for the determination in step S2.

In step S42, the charged particle beam device 1 captures an image (the above-described second image) of an i-th frame among the M frames of images for the ABCC. A variable i for processing is i=1 to M.

In step S43, the charged particle beam device 1 performs end determination processing of determining whether to end the ABCC processing. The ABCC end determination is, for example, a determination as to whether the BC value of the image is suitable, and may be saturation determination processing as the same content as the image evaluation processing of step S22, or may be another processing.

Step S44 is a branch corresponding to a determination result of step S43, when the ABCC is ended (Y), the process exits the loop of step S4 and proceeds to step S5, and when the ABCC is not ended (N), the process proceeds to step S45.

In step S45, the charged particle beam device 1 determines the adjusted BC value by adjusting the BC value of the ABCC for the imaging target, and sets the adjusted BC value as the setting value of the ABCC function. In this setting, the setting value of the ABCC function, which is a part of the setting information 202B of the memory 202 of FIG. 2 and described as the BC value which is the initial setting value in step S1 is updated. That is, thereafter, when the BC value of step S1 is referred to as repetition of the flow in accordance with the imaging target, the updated BC value is referred to.

In step S5, the charged particle beam device 1 captures and acquires, for the imaging target, a predetermined number (N) of image frames for the addition processing, and performs the addition processing using the acquired N frames of images. Then, the charged particle beam device 1 generates the image for observation based on the addition processing, stores the image for observation as a part of the image data 202D of the memory 202, and outputs the image for observation to the user U1. The output is image display on the display screen of the display device 206 of FIG. 2. The number N satisfies N≥1 and N≥M in relation to the above-described number M. In order to obtain the image for observation having high quality, examples of the addition processing include, for example, processing of adding the N frames of images for each pixel to obtain a statistical value such as an average (which may be referred to as integration processing), processing of selecting a part of the images having good quality, and the like. When N=1, the addition processing may be omitted or simplified. Details of the addition processing are not limited.

[Image Evaluation (ABCC Necessity Determination)]

An example of the image evaluation processing in step S23 of FIG. 5 will be described. The computer system 10 creates a histogram for the M frames of images for evaluation of the imaging target based on a gradation value of a pixel, and evaluates presence or absence and a degree of the saturation.

Figure 6A:
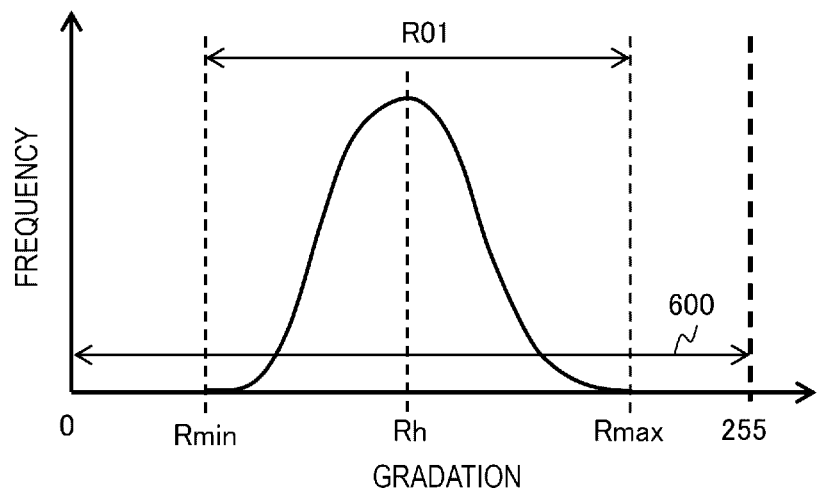
FIGS. 6A-6C are diagrams showing an example of a histogram of a captured image related to image evaluation processing in the first embodiment.

FIG. 6 shows an example of the histogram of the captured image as an explanatory diagram of the image evaluation processing. FIG. 6(A) is an example in which it is determined that the ABCC is unnecessary, and shows a case where there is no saturation as an example of the histogram of the gradation value of the image for evaluation of a certain imaging target. In each graph of FIG. 6, a horizontal axis represents the gradation value (having a correspondence relationship with the B value), and a possible gradation range 600 includes, for example, a range from 0 to 255. A vertical axis represents a frequency value for each gradation value. In FIG. 6(A), there is no distribution of the gradation value in the vicinity of 0, which is a minimum value of the gradation range 600, and in the vicinity of 255, which is a maximum value, and such a case is referred to as having no saturation. A distribution range R01 indicates a range where the frequency value of the gradation exists, and includes a minimum value Rmin and a maximum value Rmax. Rmin>0, and Rmax<255. For example, Rmin≈50 and Rmax≈200. The minimum value Rmin is, in other words, a minimum B value and corresponds to a luminance bottom in PTL 1. The maximum value Rmax is, in other words, a maximum B value and corresponds to a luminance peak in PTL 1. Further, the distribution range R01 includes a gradation value Rh having a maximum frequency value.

Figure 6B:
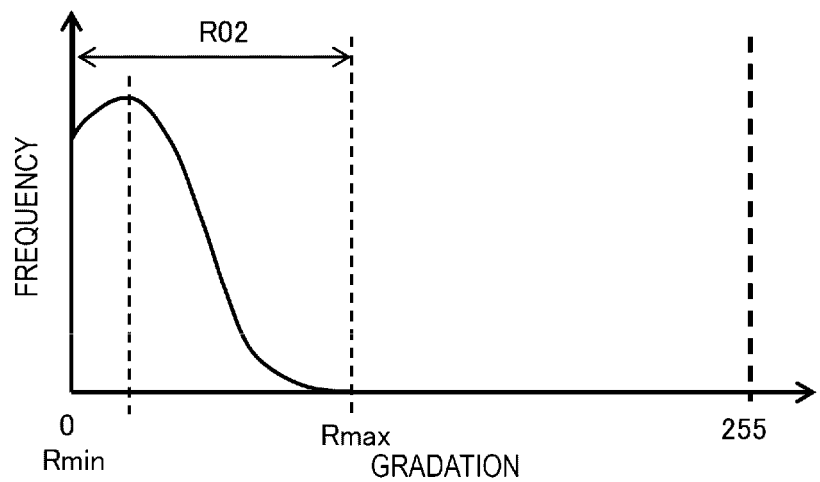
Figure 6C:
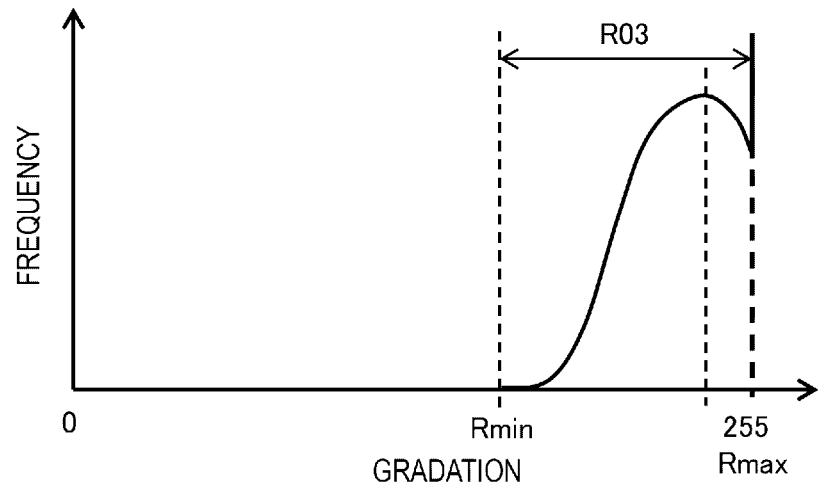

FIGS. 6(B) and 6(C) are examples where it is determined that the ABCC is "necessary", and show a case where there is saturation. In FIG. 6(B), as the distribution of the frequency value of the gradation, a distribution range R02 also exists in the vicinity of 0 which is the minimum value. The minimum value Rmin is 0. Since the B value is regarded as 0 in many pixels, the frequency value at the minimum value 0 of the gradation is particularly large. That is, in a case of FIG. 6(B), there is saturation on a low gradation side. Such saturation on the low gradation side corresponds to so-called overexposure. The overexposure is that a portion having high brightness in the image becomes completely white. In FIG. 6(C), a distribution range R03 also exists in the vicinity of 255 which is the maximum value. The maximum value Rmax is 255. Since the B value is regarded as 255 in many pixels, the frequency value at the maximum value 255 of the gradation is particularly large. That is, in a case of FIG. 6(C), there is saturation on a high gradation side. Such saturation on the low gradation side corresponds to so-called underexposure. The underexposure is that a portion having low brightness in the image becomes completely black.

The computer system 10 determines the saturation using, for example, the minimum value Rmin and the maximum value Rmax of the distribution range. For example, when Rmin≤Ra or Rmax≥Rb, the computer system 10 determines that there is saturation and determines that the ABCC is "necessary". Ra and Rb are thresholds set in advance for the evaluation, and may be, for example, Ra=0 and Rb=255.

In order to appropriately evaluate the histogram of the image for evaluation, the computer system 10 of the charged particle beam device 1 may use an image, from which noise is removed by filter processing, as the image for evaluation. As the filter, for example, a general noise removal filter such as a moving average filter, a Gaussian filter, and a bilateral filter can be applied.

[Adjustment of BC Value]

Figure 7A:
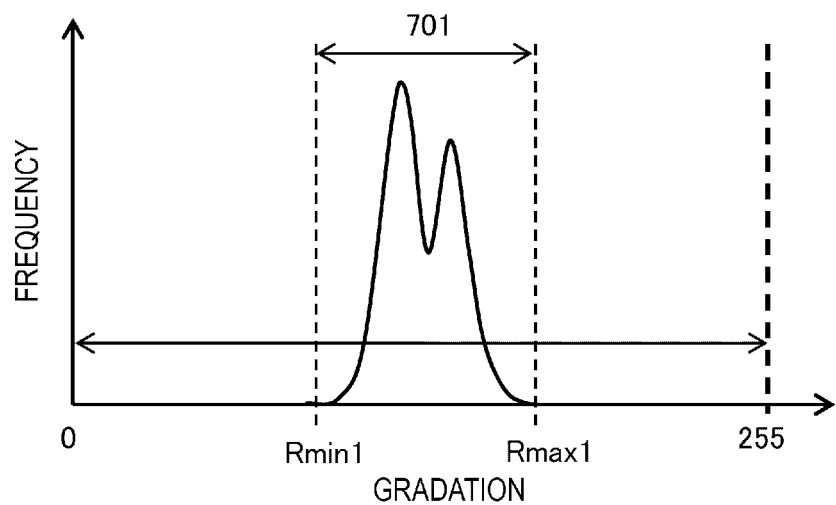
FIGS. 7A and 7B are diagrams showing an example of a histogram of a captured image as an adjustment example of a BC value obtained by ABCC in the first embodiment.
Figure 7B:
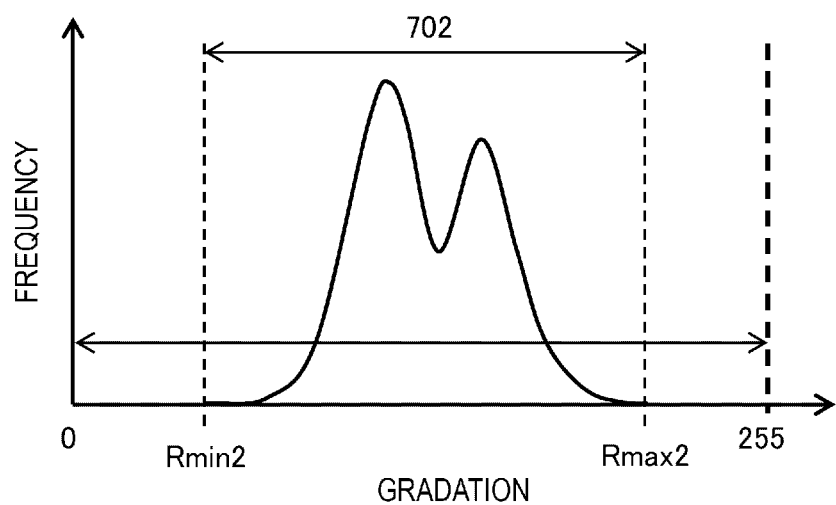

FIG. 7 shows an example of a histogram of a captured image as an example in which the BC value is adjusted by the ABCC (step S4 in FIG. 5). FIG. 7(A) shows a histogram of a gradation value in an example of an image of an imaging target before the adjustment. A distribution range 701 of the gradation value is in a relatively narrow range, and in this state, the contrast is low and it is difficult to see the image. The distribution range 701 includes a minimum value Rmin1 and a maximum value Rmax1. On the other hand, FIG. 7(B) shows a histogram in an image of an imaging target after the BC value is adjusted. A distribution range 702 of the gradation value includes a minimum value Rmin2 smaller than the minimum value Rmin1 and a maximum value Rmax2 larger than the maximum value Rmax1 so as to be wider than the distribution range 701 of FIG. 7(A). Accordingly, according to the image of FIG. 7(B), the contrast is higher than that of FIG. 7(A), and the image is more easily to see. By setting the appropriate distribution range, it is possible to obtain a suitable image for observation in which the contrast is not too low or too high, for example, an image in which the defective portion is easily observed and detected, or an image in which accurate dimension measurement is easily performed. When the minimum value Rmin2 and the maximum value Rmax2 of the adjusted distribution range 702 are determined, a predetermined reference value may be used. Details of the method of adjusting the BC value as the details of the ABCC function are not limited. For example, the method described in PTL 1 may be applied.

In the ABCC function, a correlation is assumed between the B value and the C value of the captured image and the parameter value of the detector 104. The charged particle beam device 1 adjusts the BC value based on the B value of the image obtained by the imaging, and adjusts the parameter value of the detector 104 in accordance with the BC value. In FIG. 1, the calculation control unit 107 controls the detector parameter control unit 108 to set the adjusted parameter value in the detector 104. Accordingly, a BC value of an image obtained by new imaging becomes the suitable BC value.

[Screen Example]

The user U1 can input an instruction, the setting information, and the like in accordance with a GUI on a screen provided by the computer system 10 and see the image for observation and various types of information. The user U1 can input and set the information, the condition, and the like on the imaging target of the sample 5 on the screen.

FIG. 8 shows an example of a GUI screen provided to the user U1 by the computer system 10. FIG. 8(A) shows an example of a setting screen related to an ABCC method. On this screen, the user U1 can select and set the ABCC method to be applied from several ABCC methods using the GUI such as a list box or an option button. In the present example, the ABCC method, which are options, is the first method described above (in other words, the robustness priority method), the second method (in other words, the throughput priority method), the new method of the first embodiment, and the like. The invention is not limited to a form in which the ABCC method can be selected from several ABCC methods as described above, and a form in which only the new method of the first embodiment is implemented is also possible.

FIG. 8(B) shows an example of a display screen of an ABCC result. This screen displays the information on the plurality of imaging targets of the sample 5 in a format such as a table. The target sample 5 may be one or more. The table may be provided for each sample 5. An example of the table includes an item 801 for displaying the information of the plurality of imaging targets (for example, a plurality of defective portions), an item 802 for displaying information on the presence or absence of execution of the ABCC for each imaging target (execution: Y, without execution: N), an item 803 for displaying the brightness (B) value, and an item 804 for displaying the contrast (C) value. The item 801 displays an ID ("Defect ID") for identifying the defective portion in each row. Further, the user U1 can also display the image for observation of the selected defective portion (corresponding imaging target) on the screen by selecting the row, the item, a check button, and the like from the table.

FIG. 8(C) shows an example of a screen of a stored BC value list. This screen displays a list of BC value, which is to be stored as the setting information for the ABCC function, for each manufacturing device and manufacturing process associated with the sample 5, and can be confirmed and set by the user U1. The BC value to be stored in the ABCC function is not limited to one, and a plurality of BC values can be stored as a list as candidates. This screen includes, for example, sample information 811 and a table. The sample information 811 includes identification information of the manufacturing device and the manufacturing process. The table includes a priority item 812, a B value item 813, a C value item 814, and a frequency item 815. In the priority item 812, priority can set and displayed when the priority (for example, 1, 2, 3, . . . in a descending order) is given to the stored BC value. The B value item 813 and the C value item 814 indicate the stored BC value. The frequency item 815 indicates information on the frequency associated with the stored BC value. Not only the frequency but also other related information elements may be stored or displayed. The user U1 can store and confirm the suitable BC value in accordance with the sample 5 on this screen. The user U1 can select the BC value to be applied as the above-described initial setting value (step S1 in FIG. 5) by selecting a row from the table. Further, the charged particle beam device 1 can recognize, for example, the manufacturing device and manufacturing process of the sample 5 to be processed based on such information, and automatically select the BC value to be applied as the above-described initial setting value. The information on the sample 5 is not limited thereto, and may include, for example, information such as the type of the pattern and the pattern density in the sample 5 or the imaging target.

While viewing the screen as described above, the user U1 can easily input, set, and confirm the information such as the sample information and the condition in the charged particle beam device 1, and collectively confirm an ABCC processing result of the plurality of imaging targets. It should be noted that each screen as shown in FIG. 8 can be selected from a menu, and can be similarly applied to a second embodiment to be described later.

[Effects (1-1)]

As described above, according to the charged particle beam device 1 of the first embodiment, both throughput and robustness can be achieved in a balanced manner for the ABCC function of adjusting automatically the brightness and the contrast of the captured image.

In the first embodiment, the ABCC is executed only when the ABCC is "necessary" for the imaging target by the specific processing. According to the related art, when the initial setting value of the BC value of the ABCC function is not appropriate for a certain imaging target, the saturation of luminance (for example, overexposure and underexposure) occurs, and the suitable image for observation cannot be obtained. In order to cope with this problem, in the first embodiment, even when the initial setting value of the BC value of the ABCC function is not appropriate for a certain imaging target, the ABCC is determined to be "necessary" as the result of the evaluation and the ABCC is performed, whereby the BC value is adjusted to the suitable BC value suitable for the imaging target, and the suitable image for observation can be obtained. By applying the same processing to each imaging target in the plurality of imaging targets, the presence or absence of execution of the ABCC and the update of the BC value are controlled so as to adapt to the difference and the change in pattern density of the imaging targets.

As described above, in the first embodiment, a time required for imaging as compared with the first method in which the ABCC is executed every time for each imaging target can be shortened while ensuring the height of the robustness that can be adapted to the difference in pattern density of the plurality of imaging targets of the sample 5, and thus the throughput of the entire device can be increased. In the first embodiment, regardless whether the pattern density of the sample 5 is known or unknown in advance, since it is possible to cope with the ABCC necessity determination, the efficient ABCC can be implemented.

According to the charged particle beam device 1 of the first embodiment, even when the initial setting value of the BC value of the ABCC function is not suitable for, for example, the pattern density, or the state of the defect, or a characteristic of the target sample 5, by applying the BC value adjusted in accordance with the "necessary" of the ABCC, for example, the suitable image without saturation of brightness can be obtained. According to the charged particle beam device 1, when the ABCC is applied to a plurality of imaging targets, it is not necessary to image and generate a large number of images based on the ABCC necessity determination, and for example, since the ABCC can be applied only by capturing the image once, both the robustness and the throughput can be achieved.

[Effects (1-2)]

FIG. 9 is an explanatory diagram for showing an effect of the method according to the first embodiment in more detail. FIG. 9(A) is a table summarizing an example of application of the BC value of the ABCC for a plurality of imaging targets of the sample in the robustness priority method which is the first method. A first row of the table shows IDs (for example, #1 to #m) of the imaging targets, and a second row shows applied BC values (for example, the adjusted BC value). A device of the first method executes the ABCC for a first imaging target #1, and applies BC1 as the adjusted BC value. The device executes the ABCC for each of the subsequent imaging targets #2 to #m, and applies BC2 to BCm as the adjusted BC value.

FIG. 9(B) is a table similarly summarizing an example of application of the BC value of the ABCC for a plurality of imaging targets of the sample in the throughput priority method which is the second method. A device of the second method executes the ABCC for the first imaging target #1, and applies and stores BC1 as the adjusted BC value. The device does not execute the ABCC for the subsequent imaging targets #2 to #m, and applies BC1, which is the first BC value.

FIG. 9(C) is a table summarizing an example of application of the BC value of the ABCC for a plurality of imaging targets of the sample 5 in the method of achieving both the robustness and the throughput in the charged particle beam device 1 of the first embodiment. A first row of the table shows the imaging targets (#1 to #m), and a second row shows an example of the result of the ABCC necessity determination (step S2 in FIG. 5) using the M frames. A third row shows an example of presence or absence of execution of ABCC using the M frames and the BC value at that time. A fourth row shows the BC value applied in the addition processing of the N frames (step S5 in FIG. 5). Further, an item 900 outside the table indicates an example of the BC value (initial setting value of step S1) stored in the memory 202.

The plurality of imaging targets are processed according to the flow of FIG. 5. For the first imaging target #1, the ABCC necessity determination (step S2) is performed using BC0 which is the initial setting value of the BC value, and a result is, for example, "unnecessary". In this case, the ABCC (step S4) is not performed, and the addition processing of N frames (step S5) is performed using BC0, and the image for observation is obtained. Next, for the imaging target #2, the ABCC necessity determination is performed using BC0, and a result is, for example, "unnecessary". In this case, the ABCC is not performed, and the addition processing of the N frames is performed using BC0. Next, for the imaging target #3, the ABCC necessity determination is performed using BC0, and a result is, for example, "necessary". In this case, the ABCC (step S4) is performed, and BC3 is obtained as the adjusted BC value, and is stored as a new initial setting value. That is, BC0 is updated to BC3. Then, the addition processing of the N frames is performed using the BC3. Next, for the imaging target #4, the ABCC necessity determination is performed using BC3, and a result is, for example, "unnecessary". In this case, the ABCC is not performed, and the addition processing of the N frames is performed using BC3. Thereafter, the processing is performed similarly in accordance with the necessity or non-necessity. The above-described first embodiment shows an example in which the adjusted BC value obtained by the ABCC execution when the ABCC is "necessary" in the ABCC necessity determination is updated to a new initial setting value (step S1). The invention is not limited thereto, and it is also possible to adopt a configuration in which the adjusted BC value obtained by the ABCC execution when the ABCC is "necessary" in the ABCC necessity determination is applied to a current imaging target, and is not updated as a new initial setting value. For example, after the imaging target #3 for which the ABCC is "necessary" in the ABCC necessity determination, BC0, which is the initial value of the BC value, may not be updated. In this case, in the next imaging target #4, the ABCC necessity determination is performed using BC0.

Second Embodiment

A charged particle beam device according to a second embodiment of the present disclosure will be described with reference to FIGS. 10 to 12. A basic configuration of the second embodiment is similar to that of the first embodiment. Hereinafter, configuration portions different from those of the first embodiment in the second embodiment will be described.

The charged particle beam device according to the second embodiment executes the above-described ABCC necessity determination processing (step S2 in FIG. 5) and the image capturing processing for addition for obtaining the image for observation (step S5) in parallel. When the charged particle beam device 1 determines that the ABCC is "necessary" for each imaging target, the charged particle beam device 1 interrupts the image capturing processing for addition at a time point thereof, and executes the ABCC on the imaging target to adjust the BC value in the same manner as in the first embodiment. Then, the charged particle beam device 1 newly performs image capturing processing for addition on the imaging target using the adjusted BC value to obtain an image for observation.

In the parallel processing, the charged particle beam device of the second embodiment extracts M frames (for example, one frame) for determination from N frames during imaging for addition processing, performs the ABCC necessity determination, and executes the ABCC in accordance with the "necessary" ABCC. According to the second embodiment, since the parallel processing is performed, an additional processing time for capturing M frames of images necessary for the ABCC necessity determination is not necessary as compared to the related art. That is, in the second embodiment, throughput can be further increased.

[Parallel Processing]

FIG. 10 is an explanatory diagram of an outline of the parallel processing in the second embodiment. In FIG. 10, a horizontal axis represents a time, and a vertical axis represents a case where the ABCC is "necessary" in the ABCC necessity determination for a certain imaging target in FIG. 10(A) and a case where the ABCC is "unnecessary" in the ABCC necessity determination in FIG. 10(B). First, in FIG. 10(A), processing of image capturing 1001 of N frames for addition is started from a time point t0, and is ended at a time point t3 when the imaging is performed up to N frames. In a case of FIG. 10(A), an imaging time T1 indicates a schematic time required until completion of the image capturing 1001 of N frames as the imaging target. An imaging time per frame is T1/N. Determination 1002 indicates ABCC necessity determination processing performed in parallel with the image capturing 1001. For example, at a time point t1, the M frames of images used for the ABCC necessity determination are captured. Therefore, from the time point t1, the processing of the determination 1002 using the M frames of images is started, and ends at a time point t2. A time required for the determination 1002 is shorter than that for the image capturing 1001. When a result of the determination 1002 is that the ABCC is "unnecessary", the charged particle beam device 1 continues the processing of the image capturing 1001, and the imaging up to the N frames ends at the time point t3.

Next, in FIG. 10(B), similarly, processing of image capturing 1003 of N frames is started from the time point t0. At the time point t1, determination 1004 using the M frames is started, and at the time point t2, a determination result is that the ABCC is "necessary" and the determination ends. In this case, the charged particle beam device 1 interrupts the processing of the image capturing 1003 at the time point t2 (for example, a time point at which an i-th image frame is being captured). The imaging interruption 1005 indicates a time during which the imaging is interrupted from the time point t2 to the time point t4. Although the image frames (for example, from 1 to i−1) captured until the time point t2 at which the determination is ended are stored, image frames (for example, from i to N) after the time point t2 are not captured. The charged particle beam device 1 executes, from the time point t2 at which the determination is ended, processing of ABCC 1006 on remaining image frames (for example, from i to N) that are not captured for the imaging target so as to adjust the BC value, and stores the adjusted BC value. For example, the ABCC 1006 ends at a time point t4. From the time point t4, the charged particle beam device 1 uses the adjusted BC value to perform processing of image capturing 1007 of N frames on the imaging target again to obtain an image for observation. For example, the image capturing 1007 ends at a time point t5. In a case of FIG. 10(B), an imaging time T2 indicates a schematic time required until completion of the image capturing of N frames of the imaging target. The processing of the determination 1002 and the determination 1004 are determination processing performed by the computer system 10 (the computer 200), and in many cases, the processing time is shorter and can be substantially ignored as compared to other processing such as the image capturing 1001 involving operation of hardware. Therefore, it may be considered that t2≈t1 by setting the processing time related to the determination to substantially 0.

In the second embodiment, as in FIG. 10(B), even when the ABCC is "necessary", the time required for the entire processing can be reduced by the parallel processing. That is, in the second embodiment, the throughput can be further improved as compared to the first embodiment.

[Processing Flow (2)]

FIG. 11 shows a flow of main processing performed by the computer system 10 in the charged particle beam device 1 according to the second embodiment, and the flow includes steps S201 to S207. In step S201, the computer system 10 sets or refers to a condition including the BC value, sample information, and the like. In step S202, the computer system 10 performs imaging processing of N frames of images for the addition processing. Step S202 is processing of capturing and acquiring a preset number N of frames of images by using the BC value which is an initial setting value set or referred to in step S201. Specifically, step S202 includes steps S202A, 5202B, 5202C, and 5202D. Steps S202A and 5202C are steps of a start and an end of loop processing. When a processing target frame is set to n, the loop is repeated from 1 to N when n≤N. In step S202B, imaging of the processing target frame n among the N frames is performed. Step S202D after the loop is a step of generating the image for observation by addition processing of the obtained N frames. After step S202D, the flow ends.

Further, in step S202B, when the captured processing target frame n is the predetermined number M for the ABCC necessity determination, the process proceeds to step S203. Step S203 is ABCC necessity determination processing on the imaging target. In step S203, the computer system 10 performs image evaluation processing on M (M≤N) frames of images including frames 1 to M among the images obtained by imaging in step S202, and determines whether the ABCC is necessary based on an evaluation result. This image evaluation processing is, for example, similar to that of the first embodiment.

Step S204 is a branch in accordance with the ABCC necessity determination result, and proceeds to step S205 when the ABCC is "unnecessary", and proceeds to step S206 when the ABCC is "necessary". In step S205, the computer system 10 returns to step S202 so as to continue the imaging of the N frames, and the same processing is repeated for the remaining frames. In step S206, the computer system 10 interrupts the imaging of the N frames in step S202, and the process proceeds to step S207. In step S207, the computer system 10 executes the ABCC processing on the imaging target in the same manner as in the first embodiment, and determines and sets the adjusted BC value, and the process returns to step S202. When the process returns from step S207 to step S202, the computer system 10 newly generates an image after capturing N frames of images and performing addition processing on the images using the adjusted BC value updated in step S207, and the flow ends.

[Effects (2)]

As described above, according to the second embodiment, in addition to a basic effect similar to that of the first embodiment, the throughput can be further increased by performing the parallel processing. In the second embodiment, for the plurality of imaging targets, a higher throughput can be implemented as the number of imaging targets in which the ABCC is "necessary" is smaller.

FIGS. 12 and 13 are explanatory diagrams showing the effect of the second embodiment in more detail. First, FIG. 12 shows a flow of a processing example of image capturing of N frames (step S202 in FIG. 11) in the first and second embodiments, and includes steps S211 to S214. This flow corresponds to a sequence for processing the entire plurality of imaging targets for each wafer (for example, FIG. 3) as the sample 5, and is a flow in consideration of movement of the stage 103 (FIG. 1). Steps S211 and S214 are steps of a start and an end of loop processing, and the process ends when d=D. In the present example, the imaging target is a defective portion, each defective portion is represented by a variable d, and the number of defective portions is D (d=1 to D).

In step S212, the charged particle beam device 1 moves the stage 103 on which the sample 5 is placed to a position where the defective portion d to be imaged enters the visual field 110. This movement takes a considerable amount of time.

In step S213, the charged particle beam device 1 captures an image of the defective portion d. A processing content of step S213 is substantially the same as that of FIG. 5, and includes setting of BC value (5213A), ABCC necessity determination (5213B), ABCC execution (5213D), and image capturing and addition processing of N frames (S213E).

The following are explanatory variables for estimating and calculating the effects of the first and second embodiments. A time required for entire processing of the sequence including image capturing of the plurality of imaging targets (particularly, defective portions) as shown in FIG. 12 is defined as a time TW. A time required for the ABCC processing per imaging target (defective portion d) is defined as a time TA. An average time required for the movement of the stage 103 during the imaging is defined as a time TS. A time required for capturing M frames of images for image evaluation is defined as a time TM. A time required for capturing N frames of images for addition is defined as a time TN. Among the plurality of (D) imaging targets (defective portions d), the number of imaging targets (defective portions d) for which the ABCC is determined to be "necessary" as a result of the ABCC necessity determination is defined as X (0≤X≤D).

FIG. 13 shows a graph of estimation regarding the throughput, especially the time required for the entire processing, as the effect of the second embodiment. In this graph, transition of the required time in each method is represented by a relationship with the number X of the defective portions d. In this graph, a horizontal axis represents the number X of defective portions d for which the ABCC is determined to be "necessary", and a vertical axis represents approximately estimated values of the time TW required for the entire processing. When the estimated values related to the time TW are set to TW1, TW2, TW3, and TW4, respectively, in the first method in the related art, which has robustness priority, the second method in the related art, which has throughput priority, the first embodiment, and the second embodiment, the following calculation can be performed.

In a case of the first method: TW1=D×(TN+TS+TA). As shown in FIG. 13, the time TW1 is a constant value that does not depend on the number X.

In a case of the second method: TW2=D×(TN+TS)+TA. As shown in FIG. 13, the time TW2 is a constant value that does not depend on the number X, and TW2<TW1.

In a case of the first embodiment: TW3=D×(TN+TS+TM)+X×TA. A shown line 1301 corresponds to a function TW3 (X) related to the time TW3. The time TW3 is a value that increases linearly in accordance with the number X. In a range where the number X is up to a certain number Xa, the time TW3 is shorter than the time TW1. However, in a range where the number X is equal to or larger than the certain number Xa, the time TW3 is longer than the time TW1.

In a case of the second embodiment: TW4=D×(TN+TS)+X×TA. A shown line 1302 corresponds to a function TW4 (X) related to the time TW4. The time TW4 is a value that increases linearly in accordance with the number X, and is shorter than the time TW3 in an entire range of the number X. A difference 1303 between the time TW4 and the time TW3 is D×TM. The time TW4 is the same as the time TW2 when the number X is 0, and is the same as the time TW1 when the number X is the number D. The time TW4 increases linearly in a range of the number X from 0 to the number D, and is a time between the time TW2 and the time TW1. The time TW4 is shorter than the time TW1 even when the number X is equal to or larger than the certain number Xa.

As described above, the second embodiment is more effective in terms of the throughput than the first embodiment. In each method of the first embodiment and the second embodiment, the time TW varies in accordance with the number X. The number X of defective portions d to be imaged depends on a data set in accordance with an example. The number X is about 10% with respect to the total number D in a certain example. In this case, the number X is a number Xb shown in FIG. 13. In this case, in any of the first and second embodiments, the processing time becomes a value close to the time TW2, and a sufficiently excellent effect can be obtained.

Third Embodiment

A charged particle beam device according to a third embodiment will be described with reference to FIGS. 14 and 15. The third embodiment is a modification of the first embodiment, and a part of processing is added to the configuration of the first embodiment. The charged particle beam device 1 of the third embodiment stores, into the memory, a BC value (adjusted BC value) after ABCC re-execution in ABCC execution in step S4 of FIG. 5 as a "stored BC value". Then, when capturing M frames of images for evaluation and performing image evaluation processing in ABCC necessity determination in step S2, the charged particle beam device 1 applies a condition including the stored BC value after the ABCC re-execution and stored in the memory, instead of a condition including an initial setting value of the BC value in step S1 described above. That is, in a processing flow in the third embodiment, step S1 of FIG. 5 is replaced with a step of applying the condition including the stored BC value which is a BC value after the ABCC re-execution.

The charged particle beam device 1 is not limited to a configuration in which only a latest BC value to be overwritten and updated in accordance with adjustment is stored as a setting value of the BC value of an ABCC function, and may be configured to store a history of a BC value of each past time.

Accordingly, in the third embodiment, the following effect can be obtained. As the sample 5, similar patterns and defects often exist in the same wafer. A suitable BC value adjusted by ABCC is stored for an imaging target (for example, a certain pattern or a defective portion) of the certain sample 5. The stored BC value may be an optimal solution when another imaging target (pattern or defective portion) similar to the sample 5 is imaged. Therefore, the charged particle beam device 1 of the third embodiment first tries to use, for another new imaging target, the stored BC value determined in the past in image evaluation in ABCC necessity determination.

Accordingly, according to the third embodiment, the number of times of setting (in other words, adjustment or update) of the BC value of the ABCC can be reduced in accordance with similarity of a characteristic of the sample 5, and improvement in efficiency can be expected, as compared to a configuration in which the BC value is adjusted and determined by trial and error by the ABCC every time for each imaging target.

[Processing Flow]

FIG. 14 shows a flow of main processing performed by the computer system 10 in the charged particle beam device 1 according to the third embodiment. First, in the third embodiment, the flow in consideration of movement of the stage 103 with respect to a plurality of imaging targets is the same as that in FIG. 12 described above. Details of step S213D of the ABCC execution in FIG. 12 in the third embodiment are shown in FIG. 14. In FIG. 14, step S213D includes steps S141 to S147. The flow of FIG. 14 is generally the same as the content of step S4 of FIG. 5, but in particular, the processing content of step S145 is different, and step S147 is added.

Steps S141 and S146 are steps of a start and an end of loop processing. This loop processing is repeated for each image frame in M frames for ABCC, and ends when i=maxi (=M) is satisfied using a variable i representing the image frame to be processed. In step S142, the device 1 captures an image of an i-th frame among the M frames for ABCC. Step S143 is end determination of the ABCC processing. In step S144, the process proceeds to step S147 when the ABCC ends, and the process proceeds to step S145 when the ABCC does not end.

Step S145 is a step of determining and setting the adjusted BC value, and includes steps S145A to S145D in detail. In step S145A, the computer system 10 confirms whether there is the "stored BC value" as one piece of the setting information 202B in the memory 202. The process proceeds to step S145C when there is the stored BC value, and proceeds to step S145B when there is no stored BC value. In step S145B, the computer system 10 determines the adjusted BC value based on an ABCC processing result. In step S145C, the computer system 10 reads the stored BC value of the memory 202, and determines the stored BC value as the adjusted BC value. After step S145B or step S145C, in step S145D, the computer system 10 sets the determined BC value in the ABCC function.

After step S146, in step S147, the computer system 10 stores the set BC value in the memory 202 as the "stored BC value", and accordingly, step S213D ends.

As described above, in the third embodiment, when the ABCC is "necessary" in the ABCC necessity determination (step S213B), the adjusted BC value is stored in the ABCC execution (S213D) (step S147). The stored BC value is used as the initial setting value in the BC value setting for a next imaging target (step S212). In the third embodiment, the stored BC value is sequentially set, the ABCC necessity determination is performed for each imaging target, and the ABCC is similarly executed in accordance with the "necessary" ABCC.

[Processing Example]

Figure 15A:
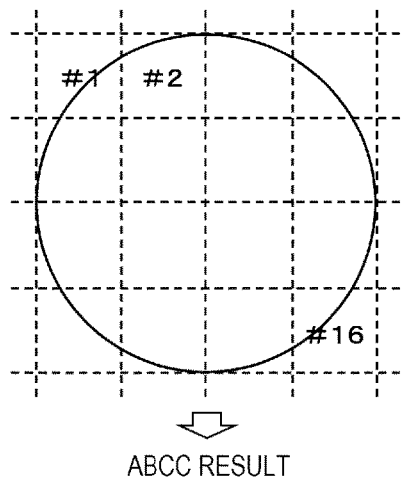
FIGS. 15A and 15B are diagrams showing an outline and an example of processing using a BC value after re-execution (stored BC value) according to the third embodiment.
Figure 15B:
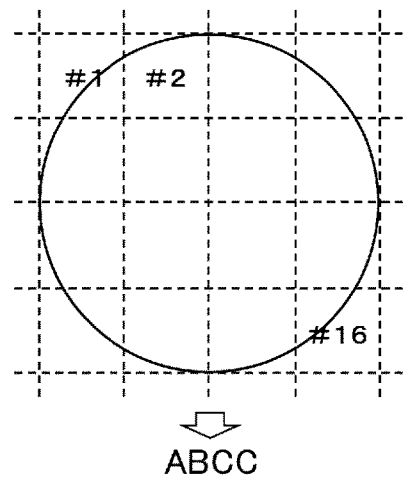

FIG. 15 shows an outline and a specific example of processing using the stored BC value which is the BC value after the ABCC re-execution in the third embodiment. FIG. 15(A) shows a plurality of imaging targets (#1 to #16) of a wafer W1 as a first sample and an ABCC result thereof. A table of the ABCC result includes the imaging target, the initial setting value and the adjusted value which are related to the BC value of the ABCC. For example, a first row shows that, for the imaging target #1 of the wafer W1, the initial setting values are b1 and c1, and the adjusted BC values are b1x and c1x as a result of the ABCC being "necessary". FIG. 15(B) shows a plurality of imaging targets (#1 to #16) of a wafer W2 as a second sample similar to the first sample of FIG. 15(A) and an ABCC applied thereto. When processing each imaging target of the wafer W2, in the ABCC necessity determination, the charged particle beam device 1 first performs control such that the adjusted BC value of the ABCC processing result of the wafer W1 (corresponding stored BC value) is tried as the BC value after re-execution, instead of the initial setting value of the BC value. When a good result is not obtained as a result of trying to apply the BC value after the re-execution, the charged particle beam device 1 may return to and try the initial setting value.

Fourth Embodiment

A charged particle beam device according to a fourth embodiment will be described with reference to FIGS. 16 and 17. The fourth embodiment is a modification of the third embodiment, and a part of processing is added.

In the fourth embodiment, the charged particle beam device 1 stores an adjusted BC value set at a time of ABCC end determination (step S43 in FIG. 5) into a memory for each manufacturing device and each manufacturing process related to the sample 5 based on sample information. When performing processing of imaging and observation on an imaging target of a new sample 5, the charged particle beam device 1 confirms the manufacturing device and the manufacturing process related to the imaging target based on the sample information. Then, when the manufacturing device and the manufacturing process related to the imaging target correspond to the manufacturing device and the manufacturing process related to the stored BC value, the charged particle beam device 1 performs control such that the stored BC value is tried and applied at a time of the ABCC necessity determination (that is, imaging and image evaluation processing on the M frames). Accordingly, a suitable BC value corresponding to the manufacturing device and the manufacturing process can be determined, and efficient processing can be expected as a whole.

In other words, the charged particle beam device 1 performs the control such that the BC value set and stored for each manufacturing device and manufacturing process is applied in accordance with the determination of the manufacturing device and the manufacturing process related to the target sample 5. The determination at a time of the application may be performed when both the manufacturing device and the manufacturing process match, or may be performed when information of only one of the manufacturing device and the manufacturing process matches. Further, as a modification, the manufacturing device (for example, semiconductor devices A, B, C, . . . ) and the manufacturing process (for example, processes A, B, C, . . . ) may be handled by being classified into groups, types, and the like in consideration of similarity, and the application may be determined in units of the same group or type even if the manufacturing device or manufacturing process is not completely the same.

[Processing Flow]

FIG. 16 shows a flow of main processing performed by the charged particle beam device 1 according to the fourth embodiment, and the flow includes steps S161 to S168. Steps S161 and S168 are steps of a start and an end of loop processing for each sample 5. In step S162, the charged particle beam device 1 loads a wafer which is the target sample 5. That is, the charged particle beam device 1 puts the sample 5 in an airtight chamber of the housing 100 of FIG. 1, places and holds the sample 5 on the stage 103, moves the stage 103, and positions the stage 103 such that the imaging target of the sample 5 enters the visual field 110. In step S163, the computer system. 10 loads sample information related to the target sample 5 from the memory 202 to, for example, a work area, and recognizes a manufacturing device and a manufacturing process related to the sample 5. In step S164, the computer system 10 loads a stored BC value list associated with the sample 5 from the memory 202. The stored BC value list is one piece of the setting information 202B (FIG. 2) related to the ABCC function, and is information including at least one stored BC value, and a specific example thereof is shown in FIG. 8(C).

In step S165, the charged particle beam device 1 performs imaging processing on a plurality of imaging targets in the loaded sample 5. A content of step S165 is the same as, for example, the flow of FIG. 12, and includes ABCC execution corresponding to the ABCC necessity determination. The imaging target is, for example, a defective portion (including a portion suspected to be a defect) on the wafer. In step S166, the charged particle beam device 1 stores the BC value list (which may include the updated BC value) on the work area into the memory 202 by being associated with the sample information of the target sample based on a processing result of step S165. That is, the stored BC value list of the memory 202 is appropriately updated. In step S167, the charged particle beam device 1 unloads the wafer which is the processed sample 5. That is, the charged particle beam device 1 discharges the sample 5 from the airtight chamber of the housing 100 of FIG. 1 to an outside.

As described above, in the fourth embodiment, the charged particle beam device 1 refers to and stores the stored BC value list together with the sample information, particularly as shown in steps S164 and S166. The charged particle beam device 1 refers to the loaded sample information of the sample 5 and refers to the stored BC value list matching the sample information. Then, the charged particle beam device 1 applies one or more BC values in the stored BC value list to the ABCC necessity determination and the ABCC processing. When the adjusted BC value is newly generated in the ABCC processing, the charged particle beam device 1 may additionally register the BC value in the stored BC value list. As a configuration of the stored BC value list, the charged particle beam device 1 may overwrite and update the BC value before the adjustment with the BC value after adjustment in the ABCC, or may be configured to store the BC value before the adjustment together with the adjusted BC value instead of erasing the BC value before the adjustment.

[Processing Example]

FIG. 17 shows a configuration example of a table for managing the sample information and the like in order to show a processing outline and a specific example in the fourth embodiment, and the table corresponds to the example of input and setting of the sample information described above. The table includes items such as an imaging target, a sample, a manufacturing device, a manufacturing process, a stored BC value, and a condition. For example, an imaging target whose ID=1001 is associated with a sample W01 related to a manufacturing device Dev1 and a manufacturing process Pro1. A stored BC value (B value and C value) stored in association with the manufacturing device Dev1 and the manufacturing process Pro1 is, for example, b1 and c1. Further, information associated with the stored BC value, includes an imaging and detection condition (for example, detector parameters: p11, p12, . . . ), and the like.

Further, for example, an imaging target whose ID=3001 in another sample W03 is associated with the manufacturing device Dev1 and the manufacturing process Pro1 as well as the sample W01. Therefore, when the imaging object whose ID=3001 of the sample W03 is newly processed, the same stored BC value (b1 and c1) as the imaging target whose ID=1001 is applied. As a result of the application, when the BC value is suitable, the BC value (b1 and c1) is also stored in the stored BC value item for the sample W03 to be imaged whose ID=3001.

According to the fourth embodiment, the following effects are obtained. Samples having the same or similar manufacturing device and manufacturing process are highly likely to have similar patterns or similar defects. In the fourth embodiment, when the ABCC necessity determination is performed, the stored BC value is controlled to be tried first in units of the manufacturing device and the manufacturing process for the imaging target of the sample, so that the number of times of setting of the BC value of the ABCC can be reduced, and efficient processing can be performed as a whole.

Fifth Embodiment

A charged particle beam device according to a fifth embodiment will be described with reference to FIGS. 18 and 19. The fifth embodiment is a modification of the third embodiment or the fourth embodiment. The charged particle beam device 1 of the fifth embodiment creates and stores information on execution frequency (in other words, use frequency and setting frequency) for each BC value adjusted and stored in response to ABCC execution. For example, the information is stored in association with a stored BC value list. Then, based on the information on the execution frequency of the stored BC values, the charged particle beam device 1 determines an order of BC values to be tried and tries the BC values in the order when ABCC necessity determination is performed for an imaging target. The charged particle beam device 1 does not need to use all the stored BC values, and when a suitable result is obtained as a result of the trial of a certain BC value, the charged particle beam device 1 does not need to try other subsequent BC values.

As a result of repeating the application of the BC value to a plurality of various imaging targets, the information on the execution frequency of the BC value is updated. The stored BC value having a high execution frequency indicates that the stored BC value is effective for many imaging targets in the past, and there is a high possibility that the stored BC value is effective for a new imaging target. Therefore, there is a high possibility that a suitable processing result can be obtained with a small number of trials for the new imaging target. Accordingly, in the fifth embodiment, efficient processing can be implemented as a whole.

[Processing Flow]

FIG. 18 shows a flow of main processing performed by the computer system. 10 in the charged particle beam device 1 according to the fifth embodiment, and the flow includes steps S181 to S188. FIG. 18 corresponds to a flow of the ABCC execution (step S213D). Loop processing of steps S181 to S186 is the same as the loop processing of steps S141 to S146 of FIG. 14. In step S187, as a result of the loop processing, the computer system 10 updates information on the order (in other words, the priority) based on the execution frequency for the BC value set as the adjusted BC value in the ABCC. Then, in step S188, the computer system 10 stores the set BC value of the updated order in the memory 202 as the stored BC value.

[Processing Example]

FIG. 19 shows a configuration example for managing the information including the execution frequency in order to show a processing outline and a specific example in the charged particle beam device 1 of the fifth embodiment. First, FIG. 19(A) is a table of history information related to the stored BC value. The table records, as the information, the history of storage, execution, and the like of each BC value of the stored BC value based on a past performance of the processing related to the ABCC of the sample 5. As described above, the stored BC value is information of storing the BC value adjusted by the ABCC into the memory 202, and is associated with a condition including a detector parameter and the like. The execution of the stored BC value includes the ABCC necessity determination and the ABCC execution using the stored BC value. First generation and storage of the BC value can be regarded as first execution and use.

As shown in FIG. 19(A), the table of the present example includes, as items, a date and time, a stored BC value, a condition, and sample information. The date and time item is a date and time when the stored BC value is stored or executed. The stored BC value item is a stored BC value (B value and C value). The condition item is a condition including the detector parameter and the like associated with the stored BC value. The sample information item is information on a manufacturing device and a manufacturing process of the corresponding sample 5.

FIG. 19(B) is a table for managing execution frequency information on the stored BC value, which is configured by the charged particle beam device 1 based on the information of FIG. 19(A). As shown in FIG. 19(B), this table includes, as items, an order (in other words, priority), a stored BC value (B value and C value), a condition, and execution frequency. The order item shows the order or the priority in which the stored BC value indicated by a row is applied as a trial. The stored BC value item and the condition item are the same as the corresponding items in FIG. 19(A). The execution frequency item is obtained by calculating the execution frequency (or the number of times of execution) for the stored BC value shown in the row. The execution frequency is, for example, 10 times per month. A period in which the execution frequency is calculated may be, for example, an entire period or a certain period from the present to the past. Further, information obtained in a certain period for learning the sample 5 for learning may be used. In the present example, a certain stored BC value (b2 and c2) has a highest execution frequency n1 among all the stored BC values (n1>n2>n3, . . . ). Therefore, the stored BC value (b2 and c2) is set to 1 in order. The computer system 10 tries the stored BC value for the new imaging target in this order. The information of the order can be used as the "Priority" item of the screen example of FIG. 8(C).

In the fifth embodiment, the sample information (manufacturing device and manufacturing process) may not be handled. In this case, the table as shown in FIG. 19(B) can be integrated information regardless of differences in the manufacturing device and the manufacturing process related to the sample 5. When selecting the stored BC value to be applied to the imaging target of the new sample 5, the charged particle beam device 1 may select and try the stored BC value in order from the table regardless of the manufacturing device and the manufacturing process of the sample 5.

Further, in the fifth embodiment, the sample information (the manufacturing device and the manufacturing process) may be handled as in the fourth embodiment. In this case, the table as shown in FIG. 19(B) can be configured in units of the manufacturing device and the manufacturing process related to the sample 5 based on the information as shown in FIG. 19(A). That is, the table as shown in FIG. 19(B) can be configured as a plurality of tables separately for each manufacturing device and manufacturing process. In this case, when selecting the stored BC value to be applied to the imaging target of the new sample 5, the charged particle beam device 1 may confirm the manufacturing device and the manufacturing process related to the sample 5, select the stored BC value from the table corresponding to the manufacturing device and the manufacturing process, and perform the trial.

As described above, when the ABCC necessity determination and the ABCC execution are performed on the new imaging target, the charged particle beam device of the fifth embodiment performs the control so as to try the BC value from one having the high execution frequency based on the performance of the ABCC. Accordingly, in the fifth embodiment, the number of times of the trials such as BC value setting related to the ABCC processing can be reduced, and efficient processing can be implemented as a whole.

The tables and graphs described above can be displayed on a display screen of the computer system 10. Although the invention has been described in detail based on the embodiments, the invention is not limited to the embodiments described above and can be variously modified without departing from a scope.

REFERENCE SIGN LIST 1 charged particle beam device
5 sample
10 computer system
103 stage
104 detector
105 analog-to-digital converter
106 image processing unit
107 calculation control unit
108 detector parameter control unit
109 input and output unit
110 visual field
U1 user

The invention claimed is:

1. A charged particle beam device comprising:
a charged particle beam source; and
a computer system having a processor and a memory storing a program for execution by the processor, the program causing the processor to adjust brightness and contrast of an image obtained by imaging a sample, wherein
the processor is programmed to:
determine whether an adjustment of brightness and contrast of the image is necessary based on a result obtained by evaluating a first image obtained by imaging an imaging target of the sample, and
when the adjustment is determined to be necessary, execute the adjustment on a second image of the imaging target to set an adjusted brightness value and an adjusted contrast value as adjusted setting values and capture a third image of the imaging target based on the adjusted setting values to generate an image for observation, and when the adjustment is determined to be unnecessary, capture the third image of the imaging target based on setting values before the adjustment to generate the image for observation without executing the adjustment on the imaging target.

2. The charged particle beam device according to claim 1, wherein
the processor is programmed to:
execute, on the imaging target of the sample, first processing of capturing the third image and second processing of determining whether the adjustment is necessary based on the first image in parallel, and
when the adjustment is determined to be necessary by the second processing, interrupt the first processing, execute the adjustment on the second image, and generate the image for observation by performing the first processing based on the adjusted setting values, and when the adjustment is unnecessary, continue the first processing and generate the image for observation by performing the first processing based on the setting values before the adjustment without performing the adjustment on the second image.

3. The charged particle beam device according to claim 1, wherein
the processor is programmed to:
store the adjusted brightness value and the adjusted contrast value as stored values when the adjustment is executed on the second image of the imaging target, and
for a new imaging target, when it is determined whether the adjustment is necessary, evaluate the first image imaged by applying the stored values.

4. The charged particle beam device according to claim 3, wherein
the processor is programmed to:
refer to sample information including a manufacturing device and a manufacturing process related to the sample,
store the adjusted brightness value and the adjusted contrast value as the stored values in accordance with the manufacturing device and the manufacturing process, and
for the new imaging target, when it is determined whether the adjustment is necessary, evaluate the first image imaged by applying the stored values in accordance with the corresponding manufacturing device and the manufacturing process.

5. The charged particle beam device according to claim 3, wherein
the processor is programmed to:
store a frequency of application or the number of times of application for each brightness value and contrast value in the stored values, and
for the new imaging target, when it is determined whether the adjustment is necessary, sequentially try the brightness value and the contrast value of each of the stored values based on the frequency or the number of times.

6. The charged particle beam device according to claim 4, wherein
the processor is programmed to:
store a frequency of application or the number of times of application for each brightness value and contrast value in the stored values, and
for the new imaging target, when it is determined whether the adjustment is necessary, sequentially try the brightness value and the contrast value of each of the stored values based on the frequency or the number of times.

7. The charged particle beam device according to claim 1, wherein
the processor is programmed to:
refer to a condition including setting values of the brightness value and the contrast value of the function,
determine whether the adjustment is necessary based on a result obtained by evaluating one or more (M) frames of the first images obtained by imaging the imaging target in a plurality of imaging targets of the sample under the condition, and
when the adjustment is determined to be necessary, execute the adjustment on one or more (M) frames of the second images of the imaging target to set the adjusted brightness value and the adjusted contrast value, and capture one or more (N) frames of the third image of the imaging target based on the adjusted setting values to generate the image for observation, and when the adjustment is determined to be unnecessary, capture one or more (N) frames of the third images of the imaging target based on setting values before the adjustment to generate the image for observation without executing the adjustment on the imaging target.

8. A method of adjusting brightness and contrast of an image obtained by imaging a sample using a charged particle beam device, the method comprising:
determining whether an adjustment of the brightness and the contrast is necessary based on a result obtained by evaluating a first image obtained by imaging an imaging target of the sample;
when the adjustment is determined to be necessary, executing the adjustment on a second image of the imaging target to set an adjusted brightness value and an adjusted contrast value as adjusted setting values and capturing a third image of the imaging target based on the adjusted setting values to generate an image for observation; and when the adjustment is determined to be unnecessary, capturing the third image of the imaging target based on setting values before the adjustment to generate the image for observation without executing the adjustment on the imaging target.

* * * * *